United States Patent
Thomas et al.

(10) Patent No.: US 7,011,705 B2
(45) Date of Patent: Mar. 14, 2006

(54) NONLINEAR OPTICAL MATERIALS AND PROCESS FOR THE PREPARATION THEREOF

(75) Inventors: Pamela Anne Thomas, Oxon (GB); Keith Beveridge Hutton, Margate (GB); Roger Charles Chavannes Ward, Bucks (GB)

(73) Assignee: The University of Warwick, Coventry (GB)

( * ) Notice: Subject to any disclaimer, the term of this patent is extended or adjusted under 35 U.S.C. 154(b) by 0 days.

(21) Appl. No.: 10/333,623

(22) PCT Filed: Jul. 17, 2001

(86) PCT No.: PCT/GB01/03220

§ 371 (c)(1),
(2), (4) Date: Oct. 27, 2003

(87) PCT Pub. No.: WO02/06570

PCT Pub. Date: Jan. 24, 2002

(65) Prior Publication Data

US 2004/0060501 A1  Apr. 1, 2004

(30) Foreign Application Priority Data

Jul. 17, 2000 (GB) .................................. 00175616

(51) Int. Cl.
*C30B 7/00* (2006.01)

(52) U.S. Cl. .............................. 117/68; 117/69; 117/70; 117/948

(58) Field of Classification Search .................. 117/68, 117/69, 70, 948
See application file for complete search history.

(56) References Cited

U.S. PATENT DOCUMENTS 5,157,754 A * 10/1992 Bierlein et al. ............. 385/122
5,879,590 A *  3/1999 Blom et al. ................. 252/584
6,304,584 B1 * 10/2001 Krupke et al. ................ 372/22

FOREIGN PATENT DOCUMENTS

EP          573737        * 12/1993

OTHER PUBLICATIONS

Zumsteg et al, "KRbToOPO : A new nonlinear optical material", Journal of Applied Physics vol. 47, No. 11, Nov. 1976.*

* cited by examiner

*Primary Examiner*—Robert Kunemund
(74) *Attorney, Agent, or Firm*—Morgan, Lewis & Bockius

(57) ABSTRACT

A non-linear optical crystal of a compound having the general formula $D_xM_{1-x}TOZO_4$, including isomorphs thereof, where: D is a dopant which comprises one or both of Rb and Cs; M is selected from one or both of K and Ag; T comprises one or more of Ti, Sn and Ge, optionally together with one or both of Nb and Ta; Z is selected from one or both of P and As, optionally together with one or both of Ge and Si; and $0<x\leq0.1$.

37 Claims, 15 Drawing Sheets

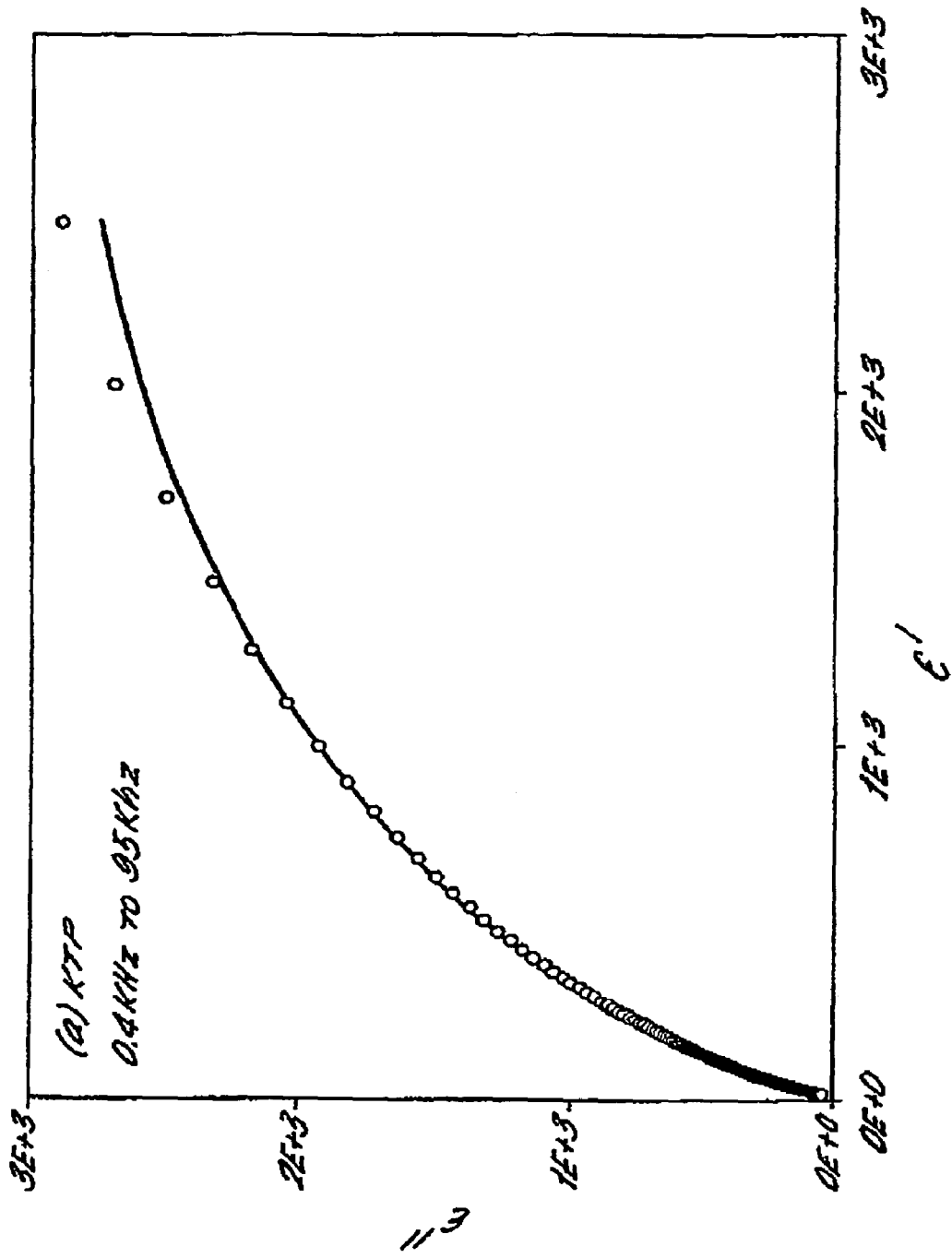

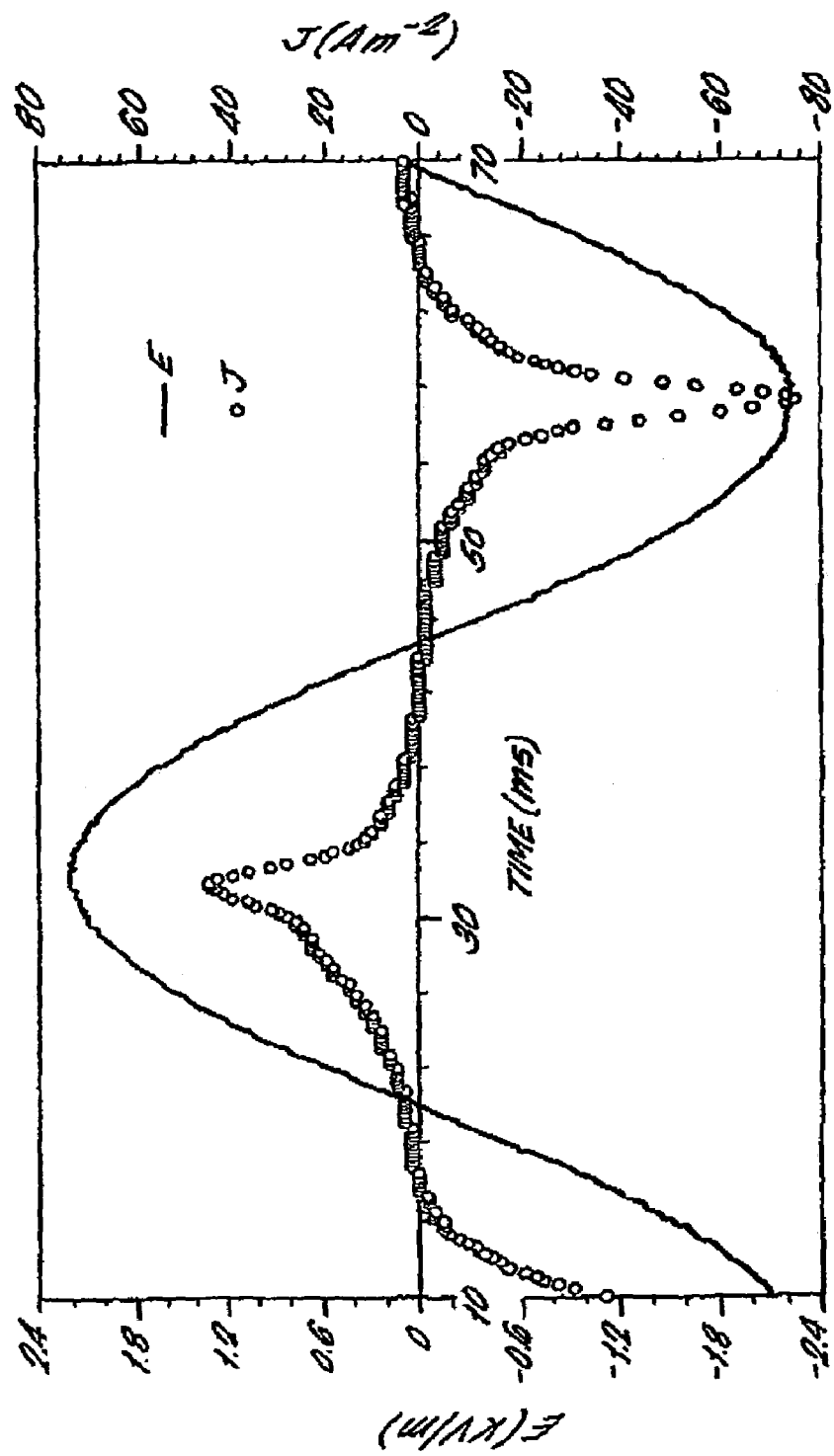
FIG. 7(C). THE ELECTRIC RESPONSE OF RKTP65
E0 = 2.2 kV/mm

RKTP 65
F=20Hz

NONLINEAR OPTICAL MATERIALS AND PROCESS FOR THE PREPARATION THEREOF

This application is a national stage filing of International Application No. PCT/GB01/03220, filed Jul. 17, 2000, which claims the benefit of of GB Application No. 0017516.6, filed Jul. 17, 2000.

The present invention relates to the field of nonlinear optical materials and, in particular, to single crystal potassium titanyl phosphate, including isomorphs thereof, which has been modified by the addition of a rubidium (Rb) and/or caesium (Cs) dopant. The Rb- and/or Cs-doped KTP has significantly lower ionic conductivity than conventional undoped KTP, with the result that the material is able to undergo ferroelectric switching or poling at room or ambient temperature.

In nonlinear optical materials the induced is dielectric polarization is not a linear function of the strength of the external electromagnetic radiation. Practical applications of nonlinear optical effects, such as frequency doubling and second-harmonic generation, are now possible with the advent of the laser which can provide very high power densities.

Potassium titanyl phosphate, $KTiOPO_4$ (KTP), is a member of a family of isomorphs which also includes $RbTiOPO_4$ (RTP), $KTiOAsO_4$ (KTA), $RbTiOAsO_4$ (RTA) and $CsTiOAsO_4$ (CTA). This family of isomorphs exhibits large nonlinear coefficients as well as chemical stability and high laser damage threshold, making them attractive for nonlinear optical (NLO) devices.

KTP is used commercially in compact, solid-state laser systems. KTP is the material of choice for frequency doubling in the important Nd: YAG laser to provide an efficient green light source. Both KTP and the arsenate isomorphs have also been used for other frequency conversion applications, such as optical parametric oscillators (OPO's) and waveguides.

For any NLO process such as second harmonic generation (SHG) to be efficient, a technique must be employed to maintain the relative phase between the interacting waves. Until recently, the standard technique was birefringence phase matching which relied on fortuitous matching of refractive indices for fundamental and harmonic frequencies in certain crystallographic directions. KTP was one of the few nonlinear crystals which could meet this criterion for a certain range of laser frequencies. However, recently the field of nonlinear optics has been transformed by the commercial realisation of quasi-phase-matched (QPM) devices in which the relative phase is corrected at regular intervals by means of a structural periodicity built into the crystal, thereby circumventing the need for natural birefringent phase matching. The most common means of achieving QPM is to introduce an array of domains of alternating structural polarity and specified periods a procedure known as periodic domain inversion (PDX). The most straight forward method of achieving PDI is to apply an electric field via periodic electrodes and this periodic poling method has proved to be effective for the ferroelectric crystals $LiNbO_3$ and $LiTaO_3$. Periodically poled lithium niobate devices have spearheaded this new technology. QPM devices have two major advantages over birefringent phase matching. Firstly, there is no restriction on crystal orientation so that the largest nonlinear coefficients ($d_{33}$ for KTP and analogues) can be accessed. Secondly, the operating range of an NLO crystal can be dramatically increased to cover its full range of optical transmission.

Although KTP has a lower $d_{33}$ NLO coefficient than $LiNbO_3$, it has significant advantages in properties such as a lower coercive field and absence of thermal effects, such as thermal lensing and thermally induced phase mismatching, which make PP-KTP an attractive non-linear optical material. However, the development of PP-KTP devices has been held up by the inherent ionic conductivity of standard flux-grown KTP which does not allow a poling field to be sustained at room temperature. In contrast, RTA has a low inherent conductivity and can be periodically poled in a relatively straightforward manner. However, RTA is expensive to produce compared with KTP, which makes the development of a low-cost, reliable route to PP-KTP still a very important objective of great commercial potential.

Zumsteg, Bierlein & Gier, Journal of Applied Physics, Vol. 47, No. 11, pages 4980–4985, 1976 relates to nonlinear optical materials based on the solid solution $K_xRb_{1-x}TiOPO_4$. With x having values of 0, 0.68 and 1, three materials are disclosed, namely $RbTiOPO_4$, $K_{0.68}Rb_{0.32}TiOPO_4$ and $KTiOPO_4$.

All the KTP family of materials melt incongruently, i.e. they decompose to liquid and solid phases of different composition at the "melting point". This precludes the use of standard melt growth techniques and a solution growth method is required.

KTP crystals of a size and quality suitable for device production have been grown by two types of technique. In the top-seeded solution growth technique (TSSG), also known as the flux growth technique, a seed crystal is lowered into a saturated solution of KTP (or analogue) in a $M_2O$—$X_2O_5$ solvent (of chosen $M_2O_5/X_2O_5$ composition), held in a platinum crucible. Controlled crystal growth is promoted by a slow ramp down of the temperature of the solution, whilst rotating the seed to aid stirring and avoid flux inclusion defects. The TSSG method is described in U.S. Pat. No. 4,231,838 and also in Hutton, Ward & Godfrey, Materials Research Society Symposium Proceedings, Vol. 329, pages 23–28, 1994. Flux growth is one of the standard commercial growth techniques for the KTP family.

The second technique is a hydrothermal method, as described in U.S. Pat. No. 3,949,323, which involves transport of feed material in an aqueous solution in an autoclave under high pressure. This method is more expensive and difficult to optimise than TSSG, and has proved successful only for KTP itself. However, hydrothermal KTP has inherently lower electrical conductivity than flux-grown KTP which has allowed PP at room temperature.

The relatively high electrical conductivity of flux grown KTP is thought to be a result of $K^+$ vacancies due to loss of $K_2O$ from the crystal at the significantly higher temperatures involved in the TSSG process compared with hydrothermal growth. A number of approaches have been suggested to overcome the problem of room temperature conductivity of KTP. In one proposal, Rosenman, Skliar, Eger, Oron and Katz, Applied Physics Letters, Vol. 73, No. 25, pages 3650–3652, 1998 suggest carrying out the poling at a low temperature where the high mobility of the $K^+$ ions responsible for the ionic conductivity is frozen out. However, the coercive field is now much higher, so that high fields are required with associated limitations on poling depth. Crystal slices in excess of 1 $cm^2$ are necessary to avoid problems at these high voltages, thus necessitating large KTP slices which increases the cost of the operation. In a second proposal, Karlsson & Laurell, Applied Physics Letters, 71 (24) pages 3474–3476, 1997 suggest ion exchange in the surface regions of flux grown KTP with rubidium. Such an ion exchange procedure results in a surface layer essentially of RTP, whose inherent low conductivity prevents a conduction path through the sample during poling. However, it will be appreciated that the resulting material will have non-homogenous properties. The method also involves costly extra processing stages.

The present invention aims to address at least some of the problems associated with the prior art.

Accordingly, in a first aspect, the present invention provides a non-linear optical crystal of a compound having the general formula $D_xM_{1-x}TOZO_4$, including isomorphs thereof, where:

D is a dopant comprising one or both of Rb and Cs;
M is selected from one or both of K and Ag;
T comprises one or more of Ti, Sn and Ge, optionally together with one or more of Nb and Ta;
Z is selected from one or both of P and As, optionally together with one or both of Ge and Si: and
$0 < x \leq 0.1$.

The non-linear optical crystal according to the present invention has a lower room temperature electrical conductivity compared with the prior art crystals such as undoped KTP.

While D will generally be either Rb or Cs, both of these dopant elements may be included in the crystal if desired. Furthermore, the properties of the crystal, such as its optical and electrical properties, may also be altered by including additional dopants. Examples of such additional dopants include one or more of Ce, Ga, Er, In, Sc and W. Typically, such additional dopant elements may be included in a total amount of up to 5 at. % with respect to M. While the Rb and/or Cs dopants are believed to substitute on the M sites, some uncertainty still exists as to where these additional dopant elements substitute in the crystal lattice.

The crystal will generally consist essentially of a compound as described herein, although it will be appreciated that the crystal may also contain a small amount of unavoidable impurities. For optimum results the level of impurities should be controlled to a level where the crystal's optical and electrical properties are not adversely effected.

Preferred examples of non-linear optical single crystals according to the present invention include $Rb_xK_{1-x}TiOPO_4$ and $Rb_xK_{1-x}TiOAsO_4$. These crystal may also include small amounts (typically $\leq 5$ at. % with respect to K) of dopant elements such as Ce, Cs, Ga, Er, In, SC and/or W. Furthermore, a small amount of Ag (typically $\leq 5$ at. % with respect to K) may be substituted for the K, while a small amount (typically $\leq 5$ at. % with respect to K) of Sn, Ge, Nb and/or Ta may be substituted for the Ti. Similarly, a small amount (typically $\leq 5$ at. % with respect to K) of Ge and/or Si may be substituted for the P or As.

The value of x may preferably range from 0.001 to 0.05, more preferably from 0.007 to 0.02, still more preferably from 0.009 to 0.017. In this manner, the room temperature electrical conductivity of the doped crystal can be decreased even further. When x ranges from 0.011 to 0.015, more preferably from 0.012 to 0.014, it has surprisingly been found that the doped crystal can undergo ferroelectric switching or poling at room or ambient temperature. Importantly, ferroelectric switching or poling may be achieved at a modest electrical field typically in the range of from 2 to 4 kV/mm, more typically approximately 3 kV/mm. A particularly marked effect has been found to occur when x is approximately equal to 0.013. In a preferred embodiment, the non-linear optical crystal according to the present invention has the formula $Rb_xK_{1-x}TiOPO_4$, where $0.011 \leq x \leq 0.015$, more preferably $0.012 \leq x \leq 0.014$, still more preferably where x is approximately 0.013.

In a preferred embodiment of the present invention there is provided a non-linear optical crystal from the $KTiOPO_4$ (KTP) family of isomorphs which includes a dopant selected from one or both of Rb and Cs, the dopant being present in the crystal in an amount of up to 10 atomic % with respect to K. Preferably the dopant is present in the crystal in an amount of up to 5 atomic % with respect to K, more preferably from 0.7 to 2 atomic %, still more preferably from 0.9 to 1.7 at. % with respect to K. The crystal may further include an additional dopant selected from one or more of Ce, Ga, Er, In, Sc and W. If present, the additional dopant will typically be present in the crystal in total amount of up to 5 atomic % with respect to K.

The dopant in the crystal is advantageously substantially homogeneously distributed in the crystal. The crystal may therefore be considered to be bulk doped in contrast to the prior art crystals which have undergone ion exchange only in the surface regions.

The present invention also provides a non-linear optical crystal as herein described which is a periodically-domain-inverted crystal.

In a second aspect, the present invention provides a process for the preparation of a doped non-linear optical crystal as herein described or an isomorph thereof, which process comprises:

(a) providing a mixture of starting materials comprising (i) $MTOZO_4$ and (ii) a flux comprising M, Z and O, or their precursors, where M is selected from one or both of K and Ag, T comprises one or more of Ti, Sn and Ge, optionally together with one or both of Nb and Ta, Z is selected from one or both of P and As, optionally together with one or more of Ge and Si, and (iii) a source of a dopant D, where D comprises one or both of Rb and Cs;

(b) heating said mixture to at least a temperature sufficient to form a substantially saturated solution of $MTOZO_4$ in said flux;

(c) contacting a seed crystal of $MTOZO_4$ with said substantially saturated solution; and (d) controllably reducing the temperature of the substantially saturated solution to thereby grow a crystal having the general formula $D_xM_{1-x}TOZO_4$, where $0 < x \leq 0.1$.

The flux composition is preferably based on a M O—$Z_2O_5$ system and the ratio of the starting materials (i) and (ii), or their precursors, may advantageously be chosen to lie within the region of the ternary phase diagram $M_2O/Z_2O_5/(TO_2)_2$ in which $MTOZO_4$ is the only stable solid phase in equilibrium with the flux when molten.

The concentration ratio of the starting materials (i) and (ii) or their precursors will typically be from 0.2 to 0.6 g/g $MTOZO_4$/flux, more typically from 0.3 to 0.5 g/g $MTOZO_4$/flux.

In one preferred embodiment, M is K, T is Ti, Z is P and the flux composition is based on the $K_2O$—$P_2O_5$ system, for example $K_5P_3O_{10}$ (K5), $K_6P_4O_{13}$ (K6) or $K_7P_3O_{11}$ (K7). In another preferred embodiment, M is K, T is Ti, Z is As and the flux composition is based on the $K_2O$—$As_2O_5$ system, for example $K_5As_3O_{10}$ (K5), $K_6As_4O_{13}$ (K6) or $K_7As_3O_{11}$ (K7). The K5 is the preferred flux.

The dopant may be provided in any form which will enable the element or elements D to be incorporated into the crystal lattice during growth. It will be appreciated that the dopant source should be free of any element which may have an adverse effect on the optical and ferroelectric properties of the crystal. A preferred source of the dopant D is $Rb_2CO_3$.

The concentration of the dopant D with respect to M in the mixture of starting materials is preferably $\leq 5$ at. %, more preferably $\leq 4$ at. %. Advantageously, the concentration of the dopant D with respect to M in the mixture of starting materials is in the range of from 0.8 to 3 at. %, preferably from 1 to 2 at. %, more preferably from 1.2 to 1.9 at. %, still more preferably from 1.6 to 1.8 at. %.

The mixture of the starting materials is typically heated to a temperature in the range of from 900 to 800° C., preferably from 880 to 810° C., more preferably from 866 to 818° C. to form the substantially saturated solution of $MTOZO_4$ in the flux.

To initiate crystal growth, the temperature of the substantially saturated solution is typically cooled at a rate of from 1 to 0.005° C./hour, preferably from 0.5 to 0.01° C./hour, more preferably from 0.03 to 0.01° C./hour. The temperature of the substantially saturated solution is advantageously controllably reduced to maintain a substantially linear increase in the weight of the growing crystal. This has been found to result in improved optical properties in the grown crystal. However, such growth runs can take a very long time. Accordingly, in practice, the temperature of the substantially saturated solution may be controllably reduced such that the overall growth profile (weight of crystal vs time) of the crystal is non-linear, the growth profile being made up of individual linear growth steps with each successive growth step having a higher gradient than the preceding growth step. Such a technique is described in greater detail in Hutton, Ward & Godfrey, Materials Research Society Symposium Proceedings, Vol. 329, pages 23–28, 1994.

The seed crystal is typically aligned along the b-axis or c-axis before being contacted with the growth solution, i.e. the substantially saturated solution of $MTOZO_4$ in the flux.

The process according to the present invention may further include the step of subjecting the grown doped non-linear optical crystal or isomorph thereof to periodic domain inversion. This can be achieved by any of the know conventional techniques, for example by applying an electrical field of appropriate strength via periodic electrodes. For crystals having the general formula $D_xM_{1-x}TOZO_4$, where $0.009 \leq x \leq 0.02$, preferably $0.009 \leq x \leq 0.017$, still more preferably $0.011 \leq x \leq 0.015$, periodic domain inversion may advantageously be carried out at a temperature of from 0 to 50° C., more preferably from 15 to 25° C., i.e. at room or ambient temperature.

In a third aspect, the present invention provides a non-linear optical device including a non-linear optical crystal as herein defined. The non-linear optical device may be a quasi-phase-matched device and examples include a waveguide device, a second-harmonic generator, an oscillator, an electro-optic modulator or a parametric amplifier. The present invention still further provides a laser which includes a non-linear optical crystal as herein described or a non-linear optical device as herein described. The non-linear optical crystals according to the present invention may be used with, for example, a Nd:YAG laser to produce a solid state waveguide laser in, for example, the green.

In a fourth aspect, the present invention provides a method of reducing the room temperature conductivity of a single crystal of $KTiOPO_4$, $KTiOAsO_4$ or isomorphs thereof, which method involves the substantially homogeneous bulk doping of the single crystal with up to 10 at. % Rb with respect to K, preferably from 0.1 to 5 at. % Rb with respect to K. To achieve ferroelectric switching or poling at room or ambient temperature, the method according to the fourth aspect of the invention preferably involves doping the single crystal with from 0.7 to 2 at. % Rb with respect to K, more preferably from 0.9 to 1.7 at. % Rb with respect to K, still more preferably from 1.1 to 1.5 at. % Rb with respect to K. Doping of the single crystal An the fourth aspect of the present invention may be achieved by incorporating Rb into the crystal during the growth by a flux growth technique, preferably a top-seeded solution growth technique.

For the avoidance of doubt, room temperature as used herein means a temperature falling in the range of from 15 to 40° C., more typically 15 to 25° C.

The process according to the present invention preferably relies on a flux growth technique, more preferably a top-seeded solution growth technique (TSSG). In this process, a seed crystal of $MTOZO_4$ is lowered into a saturated solution of $MTOZO_4$ in a flux (solvent) comprising M, Z and O, typically held in a platinum crucible in a vertical tube furnace. Thus, for the growth of KTP, a seed crystal of $KTiOPO_4$ would be lowered into a saturated solution of $KTiOPO_4$ in a flux comprising K, P and O.

The M/Z/O flux will typically comprise the oxides $M_2O$ and $Z_2O_5$ or precursors such as carbonates or nitrates of M or ammonium salts of Z, which transform to the oxides on heating. The flux may be made from, for example, mixtures of $MH_2ZO_4$ and $M_2ZHO_4$ and the relative amounts of the starting materials may be chosen so as to allow adjustment of the M/Z ratio so that the starting quantities of the ingredients fall within the desired region of the ternary phase diagram. Other materials which can be used as the flux or as a part of the flux include $MHCO_3$, $M_2CO_3$, $MNO_3$, $NH_4H_2XO_4$, $(NH_4)_2HYO_4$. $TO_2$ can also be used as a starting material and in this case $MTOZO_4$ is formed during the course of the heating.

Thus, for example, a $KTiOPO_4$—$K_6P_4O_{13}$ (K6) growth solution may be prepared by heating mixtures of the starting materials $KH_2PO_4$, $K_2HPO_4$ and $TiO_2$. When combined in the appropriate ratios, the following reactions are believed to occur on heating:

$$2KH_2PO_4 + 2K_2HPO_4 \rightarrow K_6P_4O_{13} + 3H_2O$$

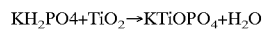
$$KH_2PO4 + TiO_2 \rightarrow KTiOPO_4 + H_2O$$

These two reactions are often considered to take place simultaneously. The $KTiOPO_4$ formed dissolves in the $K_6P_4O_{13}$ yielding a single liquid phase. In view of the temperature of the growth solution, the water is evolved as vapour. It is, however, possible that some of the water produced results in the formation of hydroxide ions dissolved in the solution.

An alternative, and preferred, method for preparing a $KTiOPO_4$—$K_6P_4O_{13}$ (K6) growth solution is by heating mixtures of the starting materials $K_2CO_3$, $NH_4H_2PO_4$ and $TiO_2$, whereby the following reactions are believed to take place;

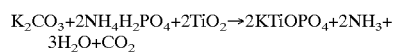
$$K_2CO_3 + 2NH_4H_2PO_4 + 2TiO_2 \rightarrow 2KTiOPO_4 + 2NH_3 + 3H_2O + CO_2$$

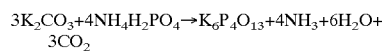
$$3K_2CO_3 + 4NH_4H_2PO_4 \rightarrow K_6P_4O_{13} + 4NH_3 + 6H_2O + 3CO_2$$

In a preferred embodiment of the process according to the present invention a $KTiOPO_4$—$K_5P_3O_{10}$ (K5) growth solution is be prepared by heating mixtures of the starting materials $K_2CO_3$, $NH_4H_2PO_4$ and $TiO_2$, whereby the following reactions are believed to take place;

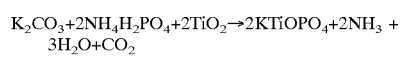
$$K_2CO_3 + 2NH_4H_2PO_4 + 2TiO_2 \rightarrow 2KTiOPO_4 + 2NH_3 + 3H_2O + CO_2$$

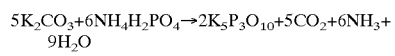
$$5K_2CO_3 + 6NH_4H_2PO_4 \rightarrow 2K_5P_3O_{10} + 5CO_2 + 6NH_3 + 9H_2O$$

Likewise, a $RbTiOPO_4$—$Rb_6P_4O_{13}$ (Rb6) growth solution may be prepared by heating mixtures of the starting materials $Rb_2CO_3$, $NH_4H_2PO_4$, $K_2HPO_4$, and $TiO_2$, whereby the following reactions are believed to take place:

$$Rb_2CO_3 + 2NH_4H_2PO_4 + 2TiO_2 \rightarrow 2RbTiOPO_4 + 2NH_3 + 3H_2O + CO_2$$

$$3Rb_2CO_3 + 4NH_4H_2PO_4 \rightarrow Rb_6P_4O_{13} + 4NH_3 + 6H_2O + 3CO_2$$

In a similar manner, a $KTiOAsO_4$—$K_6As_4O_{13}$ (K6) growth solution may be prepared by heating mixtures of the starting materials $K_2CO_3$, $NH_4H_2AsO_4$ and $TiO_2$, whereby the following reactions are believed to take place:

$$K_2CO_3 + 2NH_4H_2AsO_4 + 2TiO_2 \rightarrow 2KTiOAsO_4 + 2NH_3 + 3H_2O + CO_2$$

$$3K_2CO_3 + 4NH_4H_2AsO_4 \rightarrow K_6As_4O_{13} + 4NH_3 + 6H_2O + 3CO_2$$

Likewise, a $RbTiOAsO_4$—$Rb_6As_4O_{13}$ (Rb6) growth solution may be prepared by heating mixtures of the starting materials $Rb_2CO_3$, $NH_4H_2AsO_4$ and $TiO_2$, whereby the following reactions are believed to take place:

$$Rb_2CO_3 + 2NH_4H_2AsO_4 + 2TiO_2 \rightarrow 2RbTiOAsO_4 + 2NH_3 + 3H_2O + CO_2$$

$$3Rb_2CO_3 + 4NH_4H_2AsO_4 \rightarrow Rb_6As_4O_{13} + 4NH_3 + 6H_2O + 3CO_2$$

Controlled crystal growth is promoted by a slow ramp down of the temperature of the solution (for KTP the temperature range is typically from 860 to 910° C., while for RTP the temperature range is typically from 830 to 840° C.) while rotating the seed crystal to aid stirring and avoid flux inclusion defects. The inventors have found that the practical temperature range for growth of Rb doped KTP is typically from 900 to 800° C., more typically from 866 to 818° C.

The flux growth technique/top-seeded solution growth technique is one of the standard growth techniques for the KTP family and isomorphs and is described in U.S. Pat. No. 4,231,838 and also in Hutton, Ward & Godfrey, Materials Research Society Symposium Proceedings, Vol. 329, pages 23–28, 1994.

Typically, approximately from 50 to 70% (more typically approximately 60%) of the concentration of the dopant in the growth solution is reflected in the concentration (with respect to M) of the dopant in the final crystal.

For KTP, for example, the concentration range of the growth solution is typically from 0.2 to 0.6 g/g KTP/$K_6P_4O_{13}$. The doping concentration is $\leq 5$ atomic percent Rb with respect to K in the growth solution, which typically results in $\leq 3$ atomic percent in the grown crystal.

The present invention will now be described further, by way of example, with reference to the following Examples, taken in conjunction with the following Drawings, provided by way of example and in which:

FIGS. 1(a), (b) and (c) are Cole-Cole plots ($\in'$ vs $\in''$) for $KTiOPO_4$(KTP) (prior art), $RbTiOPO_4$ (RTP) (prior art) and $Rb_{0.0085}K_{0.9355}TiOPO_4$ (RKTP65) (invention) respectively;

Figure 7A:
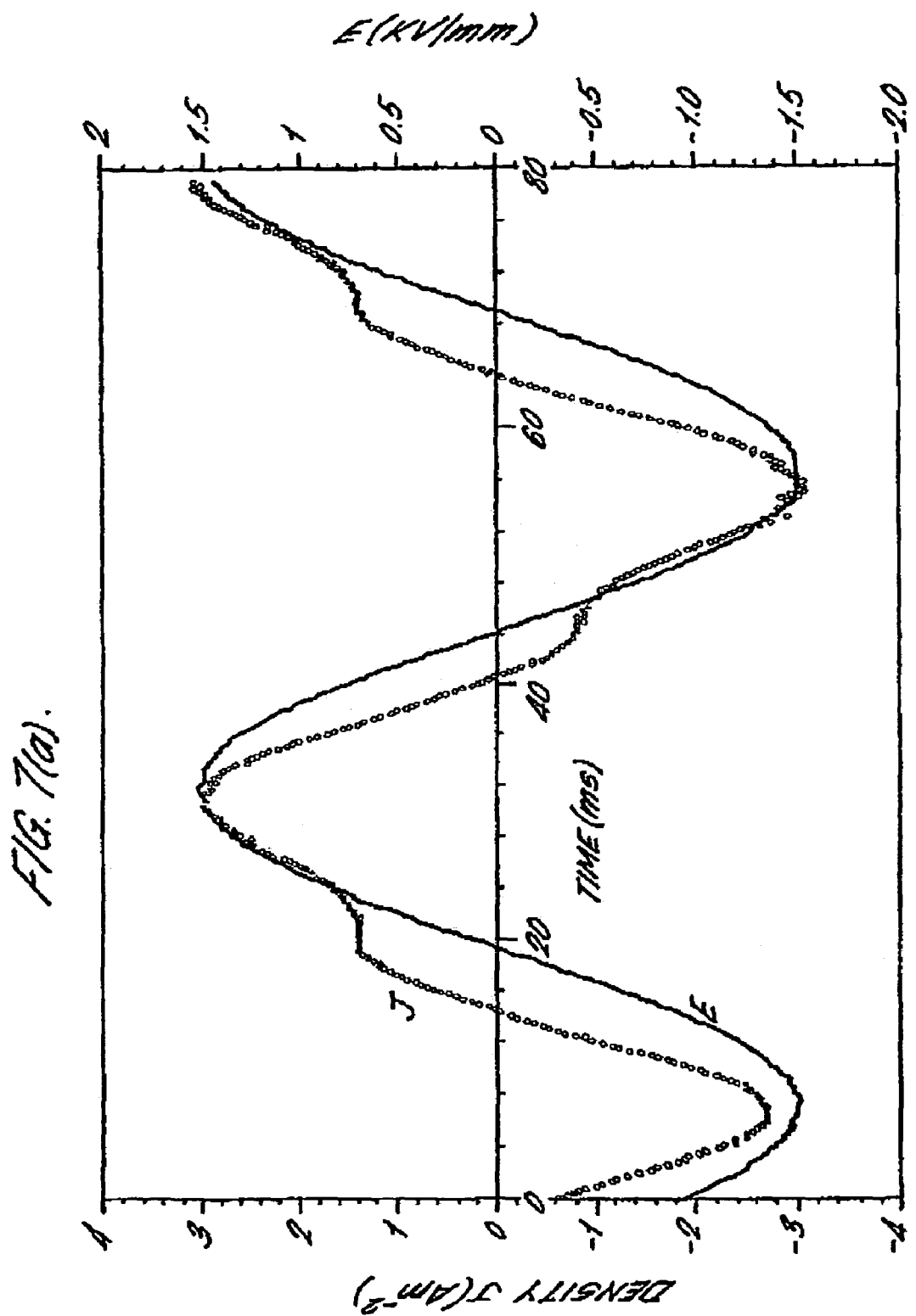
Figure 8:
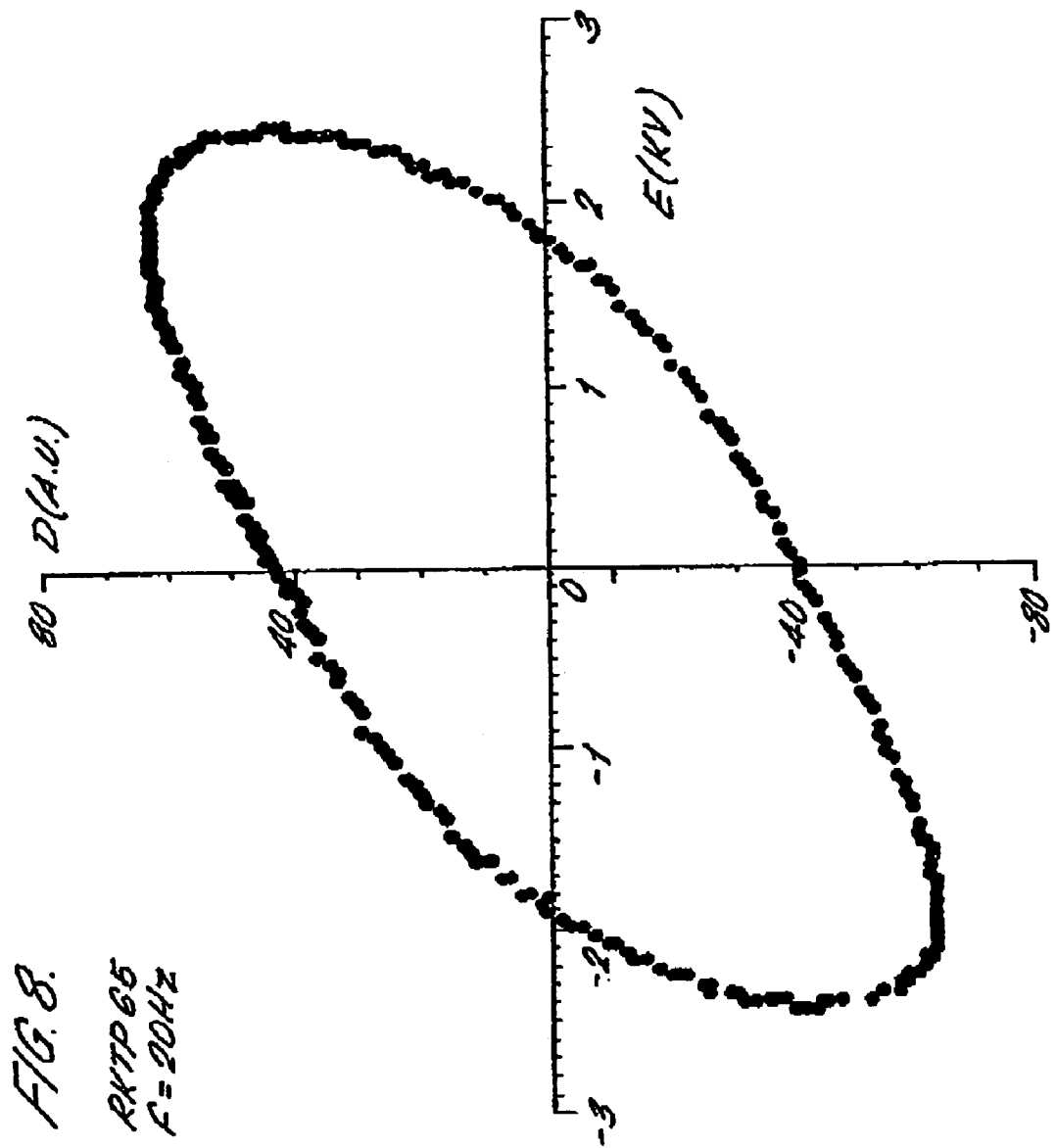
Figure 9:
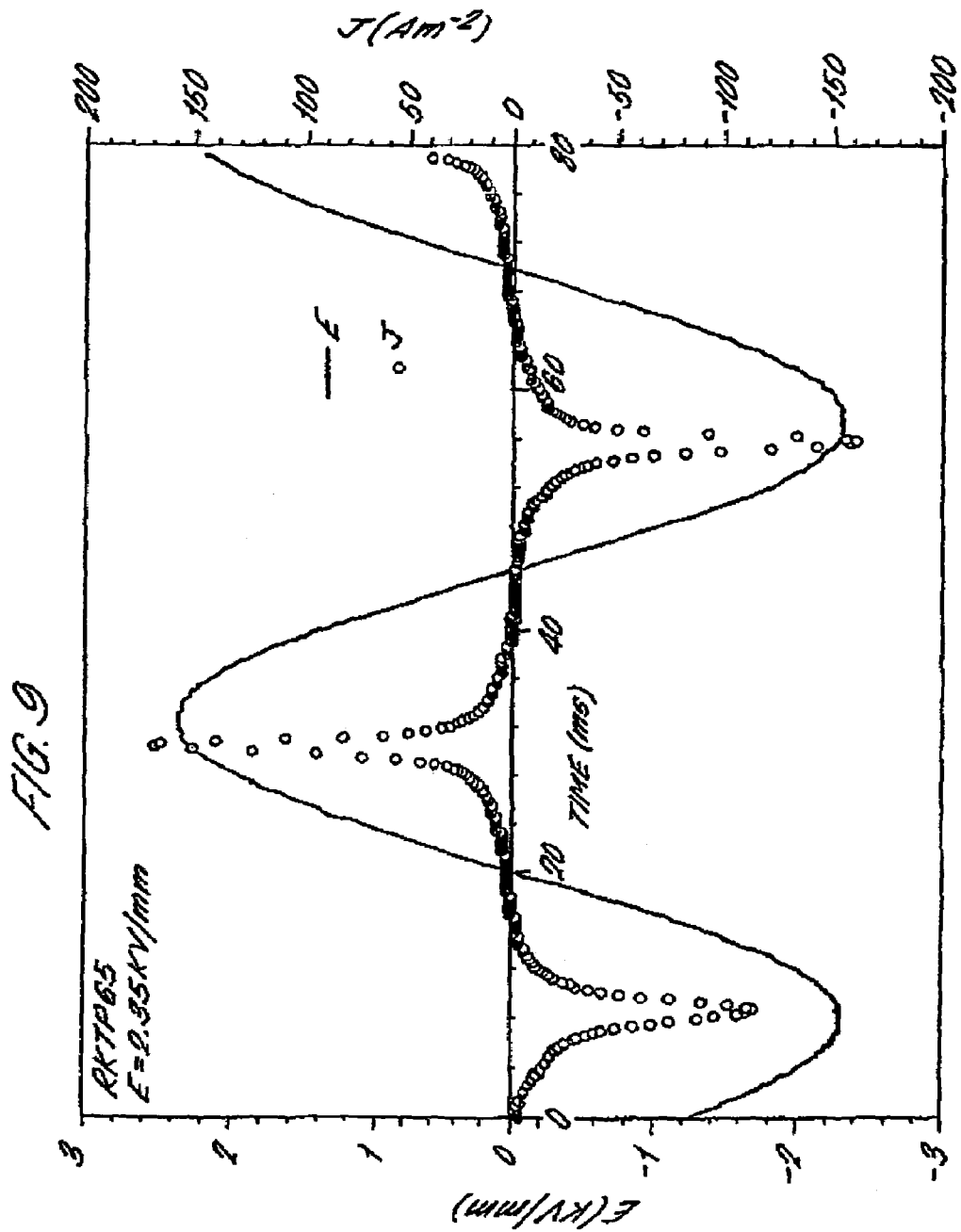
Figure 10:
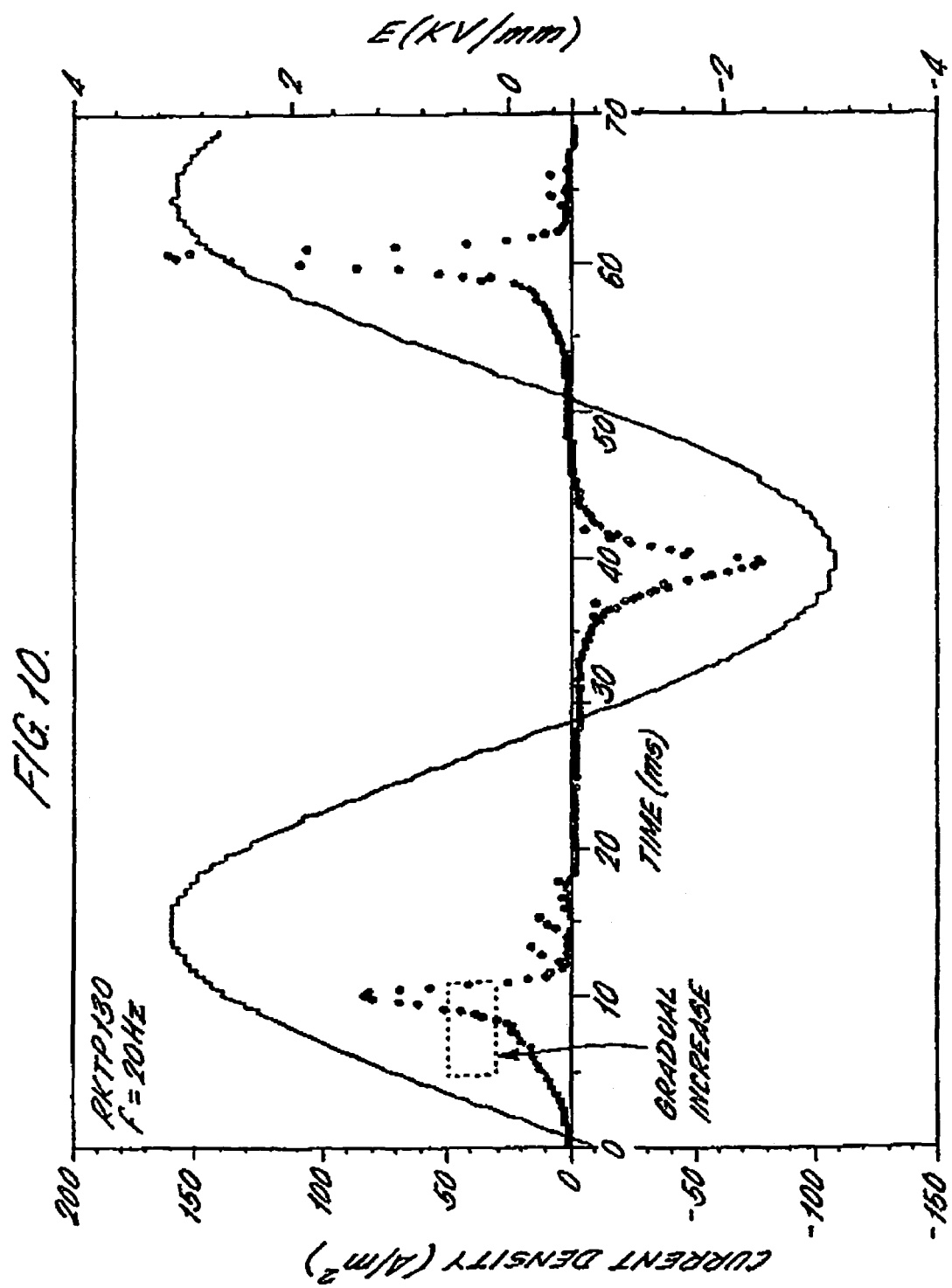
Figure 11:
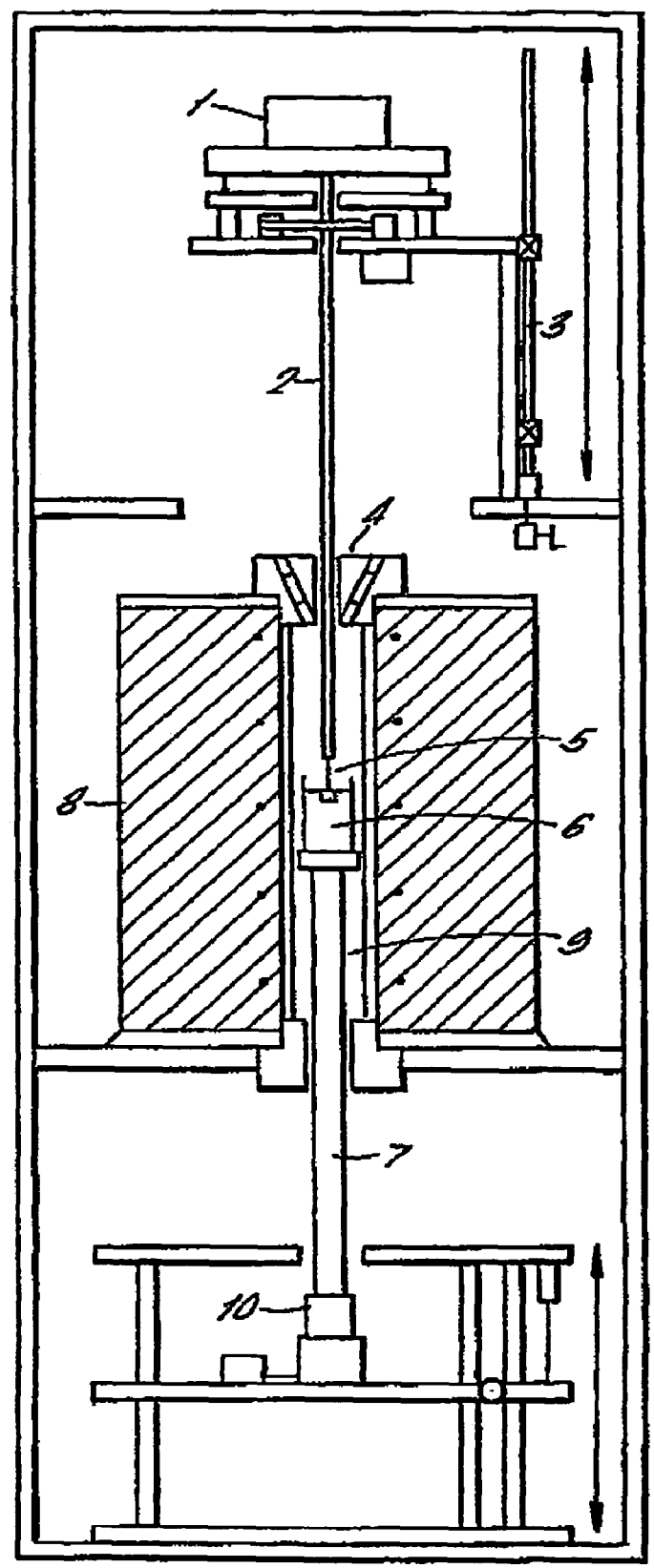

FIGS. 7(a) (b) and (c) show the typical electrical response of a RKTP65 crystal (invention) The solid curve is the electric field and the dotted curve is the current density:

FIG. 8 is a distorted hysteresis loop for RKTP65 (invention);

FIG. 9 is a series of switching current density peaks for RKTP265 (invention);

FIG. 10 is a series of switching current density peak for RKTP130 (invention); and FIG. 11 is a schematic illustration of an apparatus growing single doped crystals.

EXAMPLES

Three crystals were grown by the flux growth TSSG technique using a growth solution concentration of approximately 0.46 g/g KTP/$K_5P_3O_{10}$ (K5). The starting chemicals ($K_2CO_3$, $NH_4H_2PO_4$ and $TiO_2$) were of 99.99% purity and the (Rb) doping levels are given below. The source of the Rb dopant was $Rb_2CO_3$.

The single doped crystals were grown using an apparatus as illustrated in FIG. 11. The apparatus comprises a balance and seed rod rotation system 1 connected to a seed rod 2, which, in turn, is controlled by a seed rod positioning system 3. Crystal growth may be observed through top plug 4 with optical windows. The seed holder 5 (seed crystal not shown) is positioned in a platinum crucible 6 which contains the growth solution. The platinum crucible 6 is supported by a crucible support rod 7 and is surrounded by a three zone vertical tube furnace having a silica lining 9. The crucible 6 may be rotated by a crucible rotation system 10.

Seed crystals of undoped KTP were aligned along the b-axis. The average saturation temperature of the growth solution was 860° C. and cooling rates were in the range of from 001 to 0.03° C./hr and were adjusted to maintain a substantially linear increase of crystal weight. Growth runs were up to 70 days duration and the crystals produced were inclusion free and water-white in colour.

Further details regarding the flux growth TSSG technique may be found in Hutton, Ward & Godfrey, Materials Research Society Symposium Proceedings, Vol. 329, pages 23–28, 1994.

The Rb concentration (with respect to K) in the doped grown crystals was measured by X-ray fluorescence spectroscopy.

Example 1

RKTP65

A growth solution comprising approximately 0.86% Rb with respect to K resulted in a doped crystal in which approximately 0.65% of K ions had been replaced by Rb. Accordingly, the doped crystal may be represented as $Rb_{0.0065}K_{0.9935}TiOPO_4$, hereinafter referred to as RKTP65.

Example 2

RKTP130

A growth solution comprising approximately 1.72% Rb with respect to K resulted in a doped crystal in which approximately 1.3% of K ions had been replaced by Rb. Accordingly, the doped crystal may be represented as $Rb_{0.013}K_{0.987}TiOPO_4$, hereinafter referred to as RKTP130.

Example 3

RKTP360

This example related to a growth solution comprising approximately 3.44% Rb with respect to K.

The properties of these grown doped crystals were compared with conventional undoped $KTiOPO_4$ (KTP) and $RbTiOPO_4$ (RTP).

Several c-pieces of RKTP of thicknesses between approximately 0.4 mm to 0.6 mm were used for this investigation. In measuring the small conductivity of RKTP130, a large cross-section c-piece (approximately 21 mm×8.2 mm×1 mm) was used in order to enlarge the conductance and avoid the limiting instrumental resolution of conductance ($10^{-8}$ S). The samples were coated with silver paint, which was dried at room temperature. Before etching, the crystals were polished to an optical finish.

The conductance of the RKTP65 and RKTP130 crystals was measured by employing a HP4192A LF impedance analyser in the frequency range of from 5 Hz to 1 MHz. The data, at each frequency, was gathered via a computer interface established using the HP-Vee software (see R Helsel, A Tutorial for HP-Vee, Prentice Hall PTR, 1994).

To reveal any change in the conduction characteristics brought about by the introduction of $Rb^+$ ions into the crystal and the change in the ionic activation energy, the conductivities of RKTP65 and RKTP130 crystals, as well as those of KTP and RTP, were measured in the temperature range of from 250 to 320 K.

The temperature-dependence of conductivity for ionic conducting crystals with one kind of charge carrier can be represented by the simple Arrhenius equation (see S Geller, Solid Electrolytes/Topics in Applied Physics, Springer-Verlag Berlin Heidelberg 1977):

$$\sigma(T) = \frac{\sigma_o}{T} e^{-\frac{E_a}{K_S T}} \quad (1a)$$

where $E_a$ is the ionic activation energy and $$e^{-\frac{E_a}{K_S T}}$$

is the jump frequency (see G E Murch and J C Dyre, CRC Critical Review in Solid State and Materials Science 15 (1989) 345). $K_g$ is Boltzmann's constant and $\sigma_o$ is a constant that is proportional to both the vacancy concentration and the correlation function f. The correlation function is frequency-dependent and increases from $\sigma(0)/\sigma(\omega)$ to 1. This equation can also be expressed as:

$$Ln(\sigma T) = Ln\sigma_o - \frac{E_a}{K_S T} \quad (1b)$$

This equation indicates that $Ln(\sigma T)$ is linearly dependent on the reciprocal of thermal energy ($1/K_B T$). Accordingly, plotting $Ln(\sigma T)$ as a function of ($1/K_B T$) will give rise to a line whose slope is the activation energy and those intercept is the constant $Ln\sigma_o$. The Arrhenius equation in its logarithmic form, which was developed by using a random-walk model (see J R Manning, Diffusion Kinetics for Atoms in Crystals, Van Nostand, Princeton, N.J., 1968) has been successfully used to describe ionic conductivity in many systems. However, in RKTP crystals, both $Rb^+$ and $K^+$ participate in the conduction process, known as the mixed alkali effect (MAE) (see G E Murch and J C Dyre, CRC Critical Review in Solid State and Materials Science 15 (1989) 345 and A Suzuki, H Sato and R Kikuchi, Physics Review B, 29 (1984) 3550). The conductivity may therefore be represented as:

$$\sigma = \sigma_K + \sigma_{Rb} \quad (2a)$$

$$\sigma_K = \frac{e^2 C_K c^2}{K_S T} e^{-\frac{E_K}{K_S T}} (f_{KK} + f_{KRb}) \quad (2b)$$

$$\sigma_{Rb} = \frac{e^2 C_{Rb} c^2}{K_S T} e^{-\frac{E_{Rb}}{K_S T}} (f_{RbRb} + f_{RbK}) \quad (2c)$$

where $\sigma_K$ and $\sigma_{Rb}$ are the conductivities contributed by the hopping of $K^+$ and $Rb^+$ ions, respectively. $C_K$ and $C_{Rb}$ are their concentrations in the crystal and $E_K$ and $E_{Rb}$ are their activation energies, respectively. Lattice parameter c can be considered as the jumping distance. $f_{KK}$, $f_{RbRb}$, $f_{RRb}$ and $f_{RbK}$ are the correlation functions and $f_{KK}+f_{KRb}$ and $f_{RbRb}+f_{RbK}$ increase with frequency (see G E Murch and J C Dyre, CRC Critical Review in Solid state and Materials Science 15 (1989) 345).

A purpose-built instrument was used in the investigation of the electrical response and switching character of RKTP crystals (details submitted to Journal Physics D, Applied Physics). Under an alternating voltage $V(t)=V_o \sin(\omega t)$, the measured current density and the charge flowing through and stored in a crystal are:

$$j = \frac{dP(V(t))}{dt} + \frac{V_o \sigma(\omega)}{d\cos\theta} \cdot \sin(ax + \theta) \quad (3)$$

$$Q = S \cdot P(V(t)) + \frac{CV_o}{\cos\varphi} \sin(\omega t - \varphi) \quad (4)$$

where C and R are the capacitance and the resistance of the crystal, respectively.

$$P_s(V(t)) = \begin{cases} P_s, & V(t) > E_c \cdot d \\ -P_s, & V(t) < -E_c \cdot d \end{cases}$$

$P_s$ is the spontaneous polarisation of the crystal, $E_c$ is the coercive electric field, d is the thickness of the crystal and S is the cross-section $\omega = 2\pi f$ is the angular frequency and $\sigma(\omega)$ is the ac conductivity. θ is the phase advance of current referred to the applied electric field and ctgθ=σ/ω∈∈$_o$. φ is the phase delay of charge response referred to the applied electric field and tgφ=σ/ω∈∈$_o$.

To observe a ferroelectric hysteresis loop, a voltage is applied to compensate the charge flowing through a crystal (see P Groves, A M Glazer and D T Smith Journal Physics 1: Instrum. 17 (1984) 95).

Polished crystals were etched in KNO$_3$—KOH(1:1) at approximately 350° C. for about one minute. The crystal surfaces were cleaned using deionised water and then the crystal was examined in an optical microscope.

Dielectric Relaxation

Figure 1B:
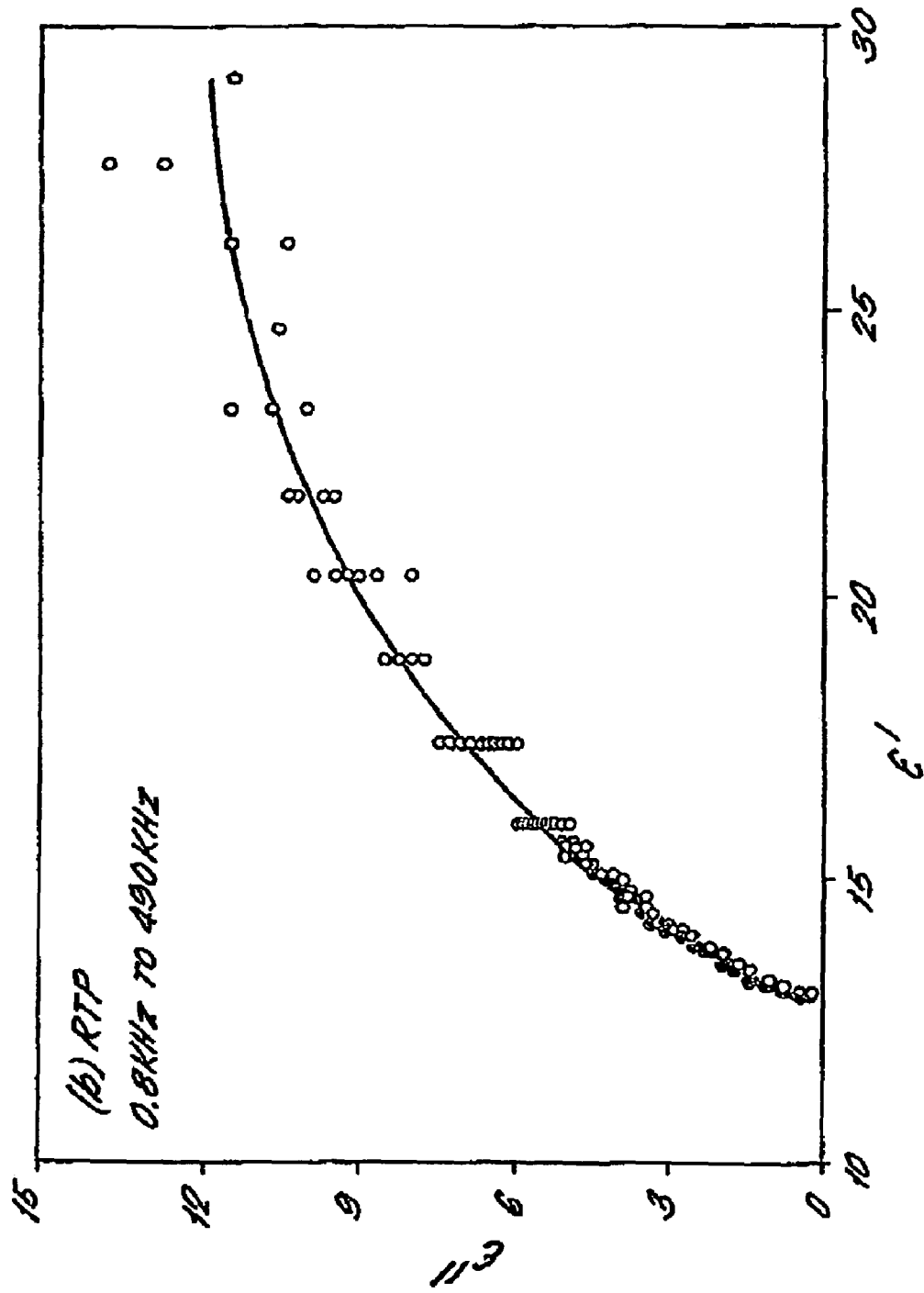
Figure 1C:
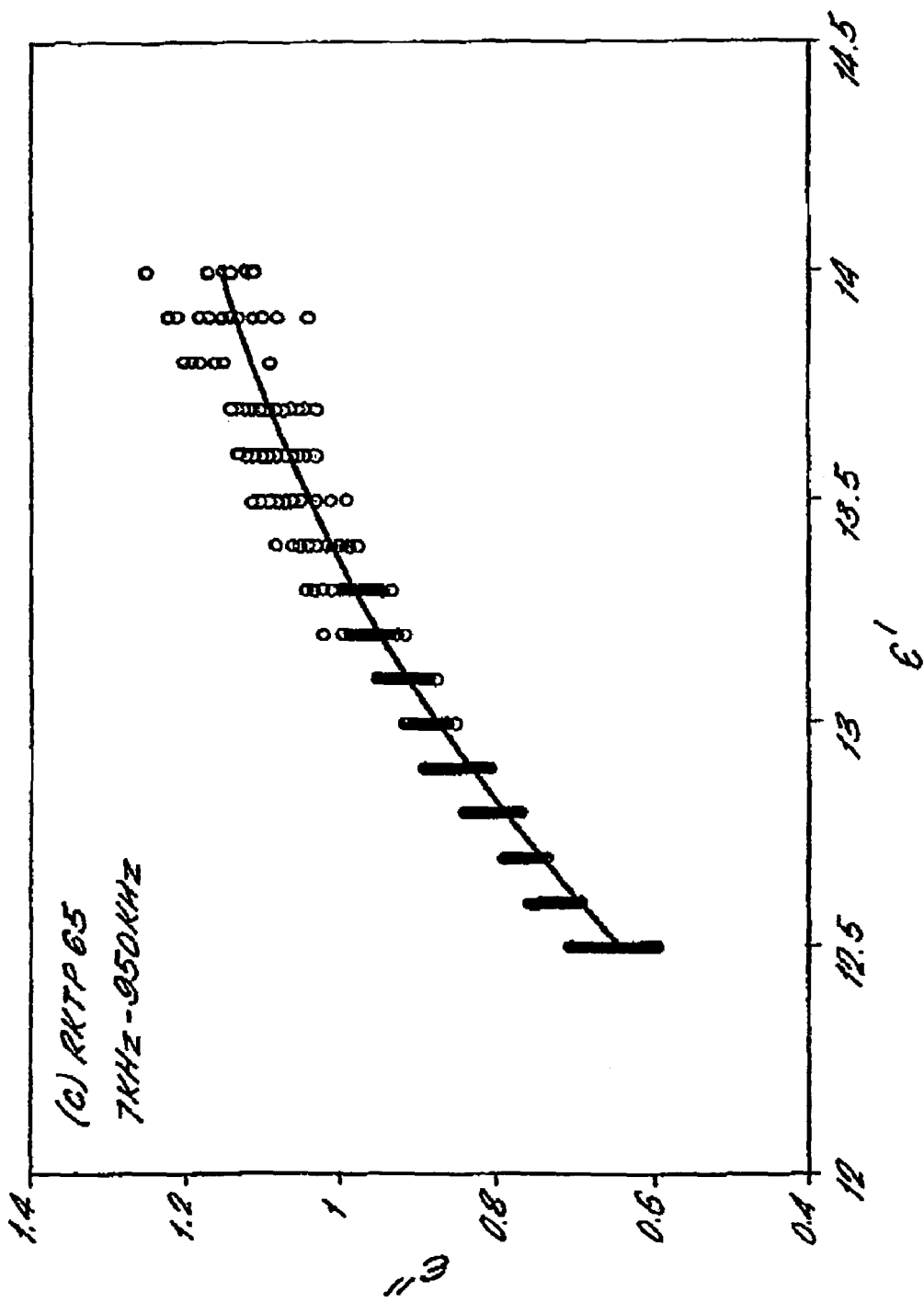

The change of the relaxation time related to the introduction of Rb$^+$ ion into KTP crystals was investigated using the Cole-Cole equation (see T J Latham and P A Thomas, Structure and Optical Properties of KRbTiOAsO$_4$, 14th European Crystallographic Meeting, Lisbon, August, 1997), which describes the complex permittivity empirically as:

$$\varepsilon^* = \varepsilon' - i\varepsilon'' = \varepsilon_\infty + \frac{\varepsilon_s - \varepsilon_\infty}{1 + (i\omega\tau_o)^{1-\alpha}} \quad (5a)$$

where ∈$_s$ is the static permittivity, ∈$_{107}$ is the permittivity at high frequency and τ$_o$ is the relaxation time. α is the angle of the semicircular arc and, when α=0, the equation changes into the form of the Debye response. ∈' and ∈" are the real and imaginary parts of the complex permittivity, respectively and can be represented as:

$$\varepsilon' = \varepsilon_\infty + \frac{1}{2}(\varepsilon_o - \varepsilon_\infty)\left[1 - \frac{\sinh(1-\alpha)x}{\cosh(1-\alpha)x + \cos\frac{1}{2}\alpha\pi}\right] \quad (5b)$$

$$\varepsilon'' = \frac{\frac{1}{2}(\varepsilon_o - \varepsilon_\infty)\cos\frac{1}{2}\alpha\pi}{\cosh(1-\alpha)x + \sin\frac{1}{2}\alpha\pi} \quad (5c)$$

Where x=ln(ωτ$_o$). The Cole-Cole plots (∈' vs ∈") of KTP, RTP and RKTP65 are shown in FIG. 1 and the relaxation time τ$_o$ and constant α obtained by fitting the imaginary permittivity to Equation 5c are listed in Table 1. The small constant α (α=0.041) and almost a quarter arc (FIG. 1a) for KTP indicate that the dielectric relaxation of KTP is very close to the Debye response. However, because of the Rb$^+$ in the RKTP65 crystal, the parameter α for RKTP is enlarged to 0.4623, which is also larger than that of RTP. Therefore, the dielectric relaxation of RKTP is further from the Debye response than that of KTP and RTP as indicated by the largest value of s in Table 2 for Equation 8. Besides, RKTP65 has a smaller relaxation time constant τ$_o$ than both pure KTP and RTP.

Frequency Dispersion of Conductivity

For a material having the Debye response character, its ac conductivity as a function of frequency can be expressed as (see A K Jonscher, Universal Relaxation Law, Chelsea Dielectric Press, London, 1996):

$$\sigma(\omega) = A \cdot \frac{\omega^2\tau^2}{1 + \omega^2\tau^2} + \sigma_D \quad (6)$$

where τ is the Debye relaxation time constant (hereinafter referred to as the time constant) which is equal to the current response time when a dielectric is subjected to a step-function voltage, or the polarisation response time when a dielectric is subjected to a delta-function voltage. σ$_D$ is the dc conductivity of the material.

Figure 2:
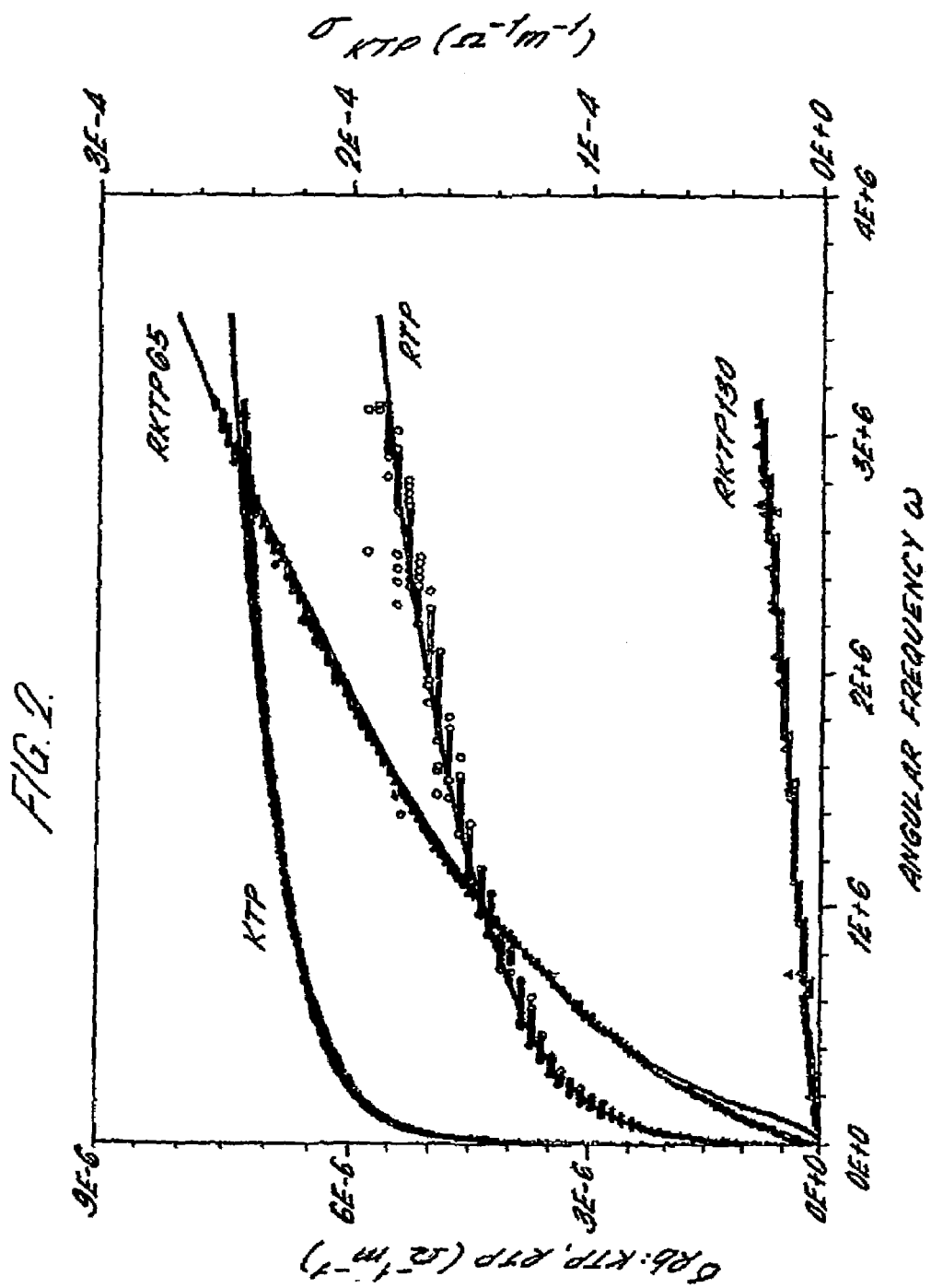
FIG. 2 shows the measured ac conductivity of RKTP65 (invention) and $Rb_{0.013}K_{0.987}TiOPO_4$ (RKTP130) (invention) as a function of frequency compared with those of KTP (prior art) and RTP (prior art)

In an ionic conductor, the ac conductivity displays frequency dispersion, as observed in many other materials, in the form of (see A K Jonscher, Universal Relaxation Law, Chelsea Dielectric Press, London, 1996):

$$\sigma(\omega) = A\omega^s \quad (7)$$

where A and s are constants for a material at a given temperature. Generally, the constant s should be in the range of from 0 to 1. Equation 6 is also consistent with the theoretical results obtained from an ion-transportation model by Alexander (Physics Review B, 23 (1981) 2951). FIG. 2 shows the measured ac conductivity of RKTP as a function of frequency compared with those of KTP and RTP. The dc conductivity σ$_D$ of RKTP65 is very small, as shown in FIG. 1, and is negligible. The solid curve for RKTP65 is the best mathematical fit to the equation:

$$\sigma(\omega) = 5.31 \times 10^{-9} \times \frac{(6.58 \times 10^{-6}\omega)^2}{1 + (6.58 \times 10^{-6}\omega)^2} \times \omega^{0.486} \quad (8)$$

Equation (7) clearly indicates that the dependence of conductivity of RKTP65 on frequency takes the form of the Debye response combined with an ion hopping effect. In the low frequency range (f<150 KHz), RKTP65 has a smaller ac conductivity than RTP and KTP, which corresponds to the smaller time constant of RKTP65 (τ=6.56 μs) as illustrated in Table 2. FIG. 1 also shows that the RKTP130 crystal has the smallest conductivity. Although a large cross-section crystal was used, the change in conductance with frequency in wide frequency ranges is less than the instrumental resolution of conductance. Therefore, the conductivity does not increase smoothly with frequency, but in a step-wise fashion. The resulting data for the RKTP130 crystal cannot be fitted reliably to an equation such as Equation 8.

Figure 3:
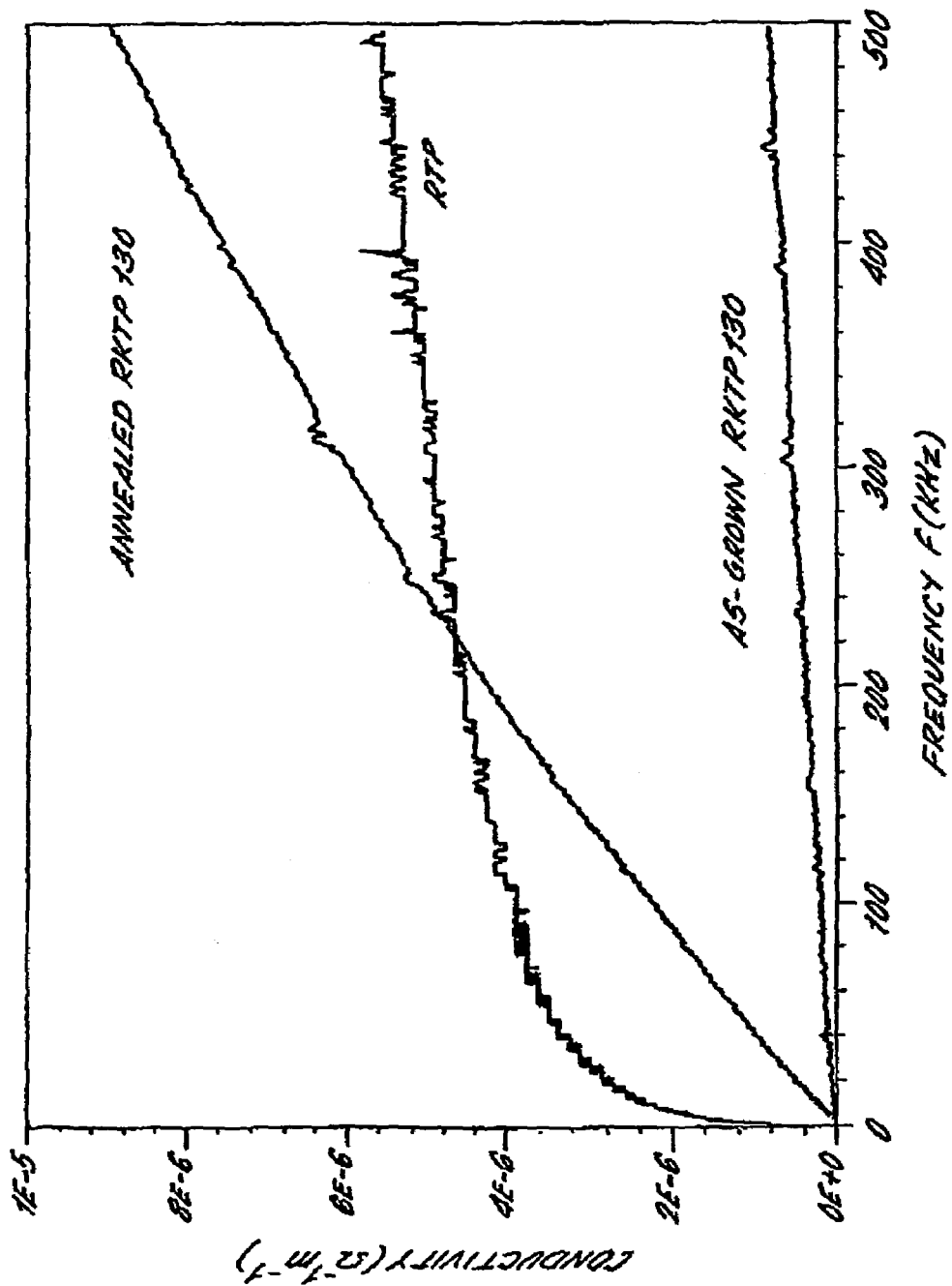
FIG. 3 shows the conductivity of annealed RKTP130 in comparison with as-grown RKTP130 and RTP.

FIG. 2 also shows that RKTP65 has a larger conductivity than RTP. To observe such a phenomenon in RKTP130, a 0.6 mm thick piece of RKTP130 was annealed at 700° C. for 24 hours to increase its vacancy concentration, as well as its conductivity. The conductivity of the annealed RKTP130 is shown in FIG. 3 in comparison with as-grown RKTP130 and RTP, whose frequency dispersion is similar to that of RKTP65. At high frequencies, theoretical work indicates that the ions take maximum advantage of the large jumping frequency by jumping backwards and forwards. On the other hand, at low frequencies, the conductivity is mainly determined by the small jumping frequencies because they partially block the dc current (see J C Dyre, Phil. Mag. 50 (1984) 585 and S Alexander, J Bernasconi, W R Schneider and R Orbach, Review Modern Physics 53 (1981) 175). Therefore, the Rb ions in KTP should have a smaller activation energy and lower jumping frequency than K in KTP and Rb in RTP This is shown by analysing the dependence of conductivity of RKTP on temperature.

Dependence of Conductivity of RKTP on Temperature

Figure 4:
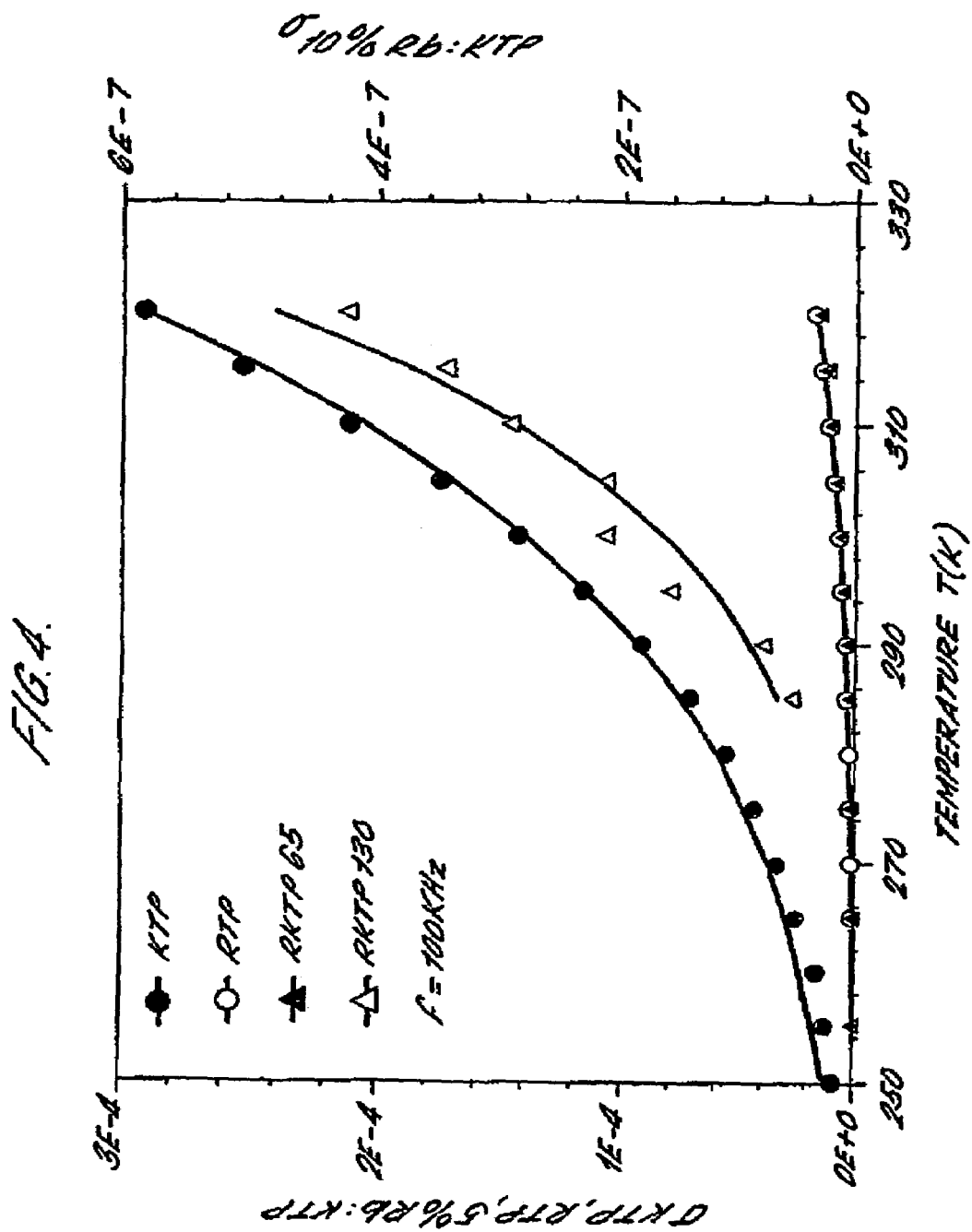
FIG. 4 shows the measured conductivity for RKTP65 (invention) and RKTP130 (invention) crystals as a function of temperature, from 250 to 320 K in comparison with KTP (prior art) and RTP (prior art)

FIG. 4 shows the measured conductivity of RKTP crystals as a function of temperature from 250 to 320 K in comparison to those of KTP and RTP. Their conductivity decreases with temperature. The parameter $(\ln(\sigma T))$ as a function of the reciprocal of thermal energy $(K_B T)^{-1}$ is plotted in FIG. 5 for all the crystals, where the lines represent the routine mathematical fits to Equation 2. The parameters $\sigma_0$ and $E_a$ obtained from the fitting are listed in Table 3. This indicates that the "vacancy concentration" $\sigma_0$ decreases with increasing $Rb^+$ concentration in the crystal while the measured activation energy increases. Both of these effects account for the decrease of the conductivity of RKTP crystals.

The mixed alkali effect was used to analyse the measured conductivity. Since a small amount of $Rb^+$ in KTP is unable to change the structural parameters, it is reasonable to consider that the activation energy of $Rb^+$ in RKTP65 is the same as that in RKTP130, and the activation energy of $K^+$ in both RKTP crystals is the same as that in KTP ($E_K$=0.3312 eV). By assuming that the correlation functions in Equations 2b and 2c are constants in the narrow temperature range (250 to 320 K) the experimental data was fitted to Equations 2a–2c and the resulting parameters are listed in Table 4. From RKTP65 to RKTP130, the decrease of conductivity should be attributed to the reduction in the correlation functions, especially that of $\sigma_K$, i.e. ($f_{KK}+f_{KRb}$) as shown in Table 4, since the changes in $C_K$ are very small. Since $E_{Rb}$ in Table 4 is larger than $E_K$ by 0.121 eV, the jumping frequency of $Rb^+$ is lower than that of $K^+$ by 2 orders of magnitude at room temperature $$\left( e^{\frac{E_{Rb}-E_K}{K_S T}} = 126 \right),$$

the life time of a $Rb^+$ ion is two orders longer than that of $K^+$ in a crystallographic site. Therefore, the inactive $Rb^+$ ions sit in the way of the $K^+$ path, resulting in the inefficient transportation of $K^+$ in the quasi-one-dimension channel.

The increase in activation energy is related to structure parameters. Since a $Rb^+$ ion (diameter d=0.294 nm), which has larger diameter than $K^+$ (d=0.266 nm), will experience more hindering force than $K^+$ in KTP, it will have a larger activation energy than $K^+$ in KTP (a=1280 nm, b=0.640 nm, c=1.058 nm). On the other hand, since RTP has larger lattice parameters a and b (a=1.395 nm, b=0.650 nm, c=1.056 nm) than KTP, $Rb^+$ in KTP will be presented with a higher energy barrier than Rb in RTP, and thus a larger activation energy.

Electrical Response of RKTP Crystals

Figure 5:
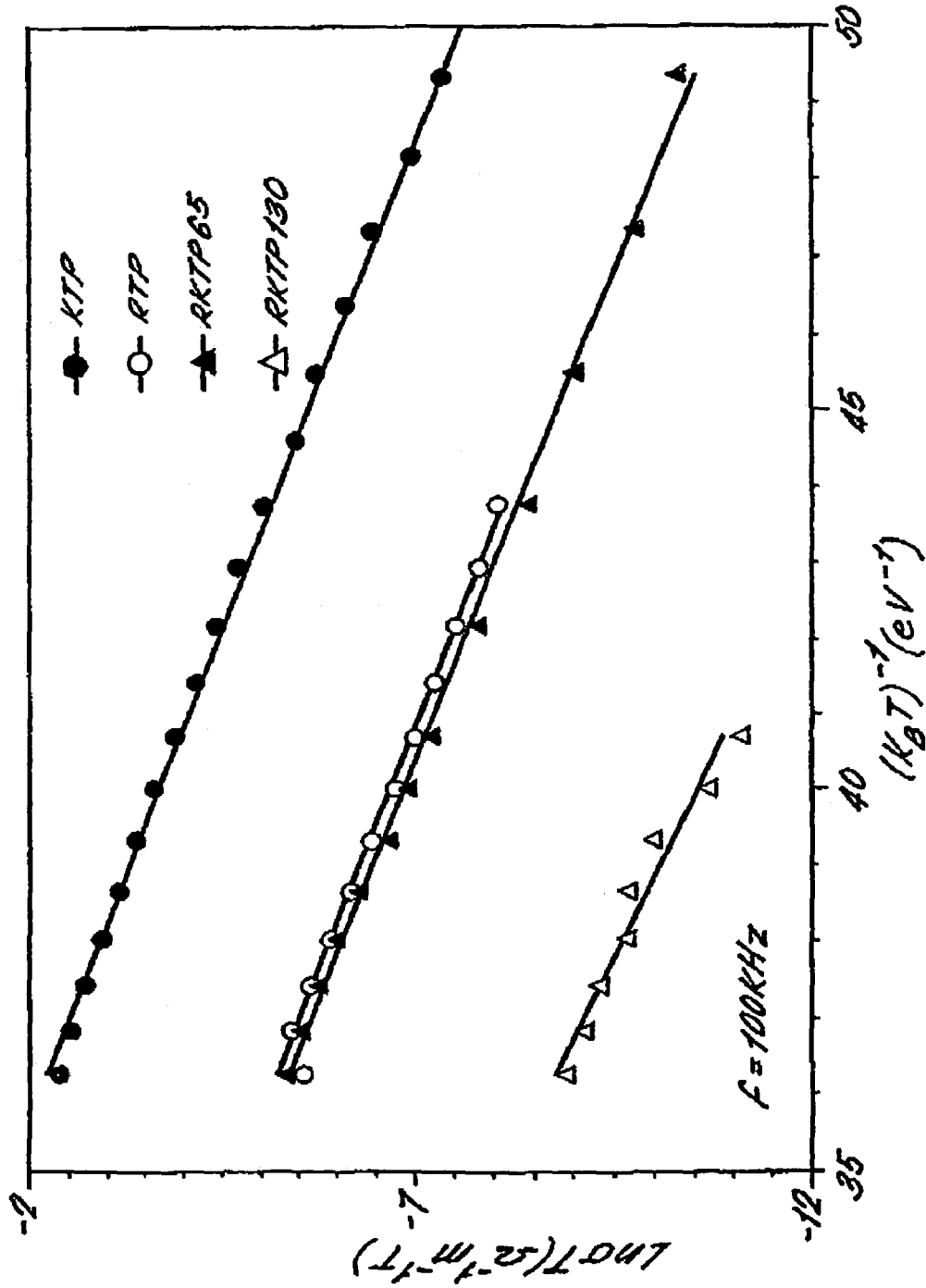
FIG. 5 is a plot of the parameter ($\ln(\sigma T)$) as a function of the reciprocal of thermal energy $(K_a T)^{-1}$ for RKTP65 (invention), RKTP130 (invention), KTP (prior art) and RTP (prior art)
Figure 6:
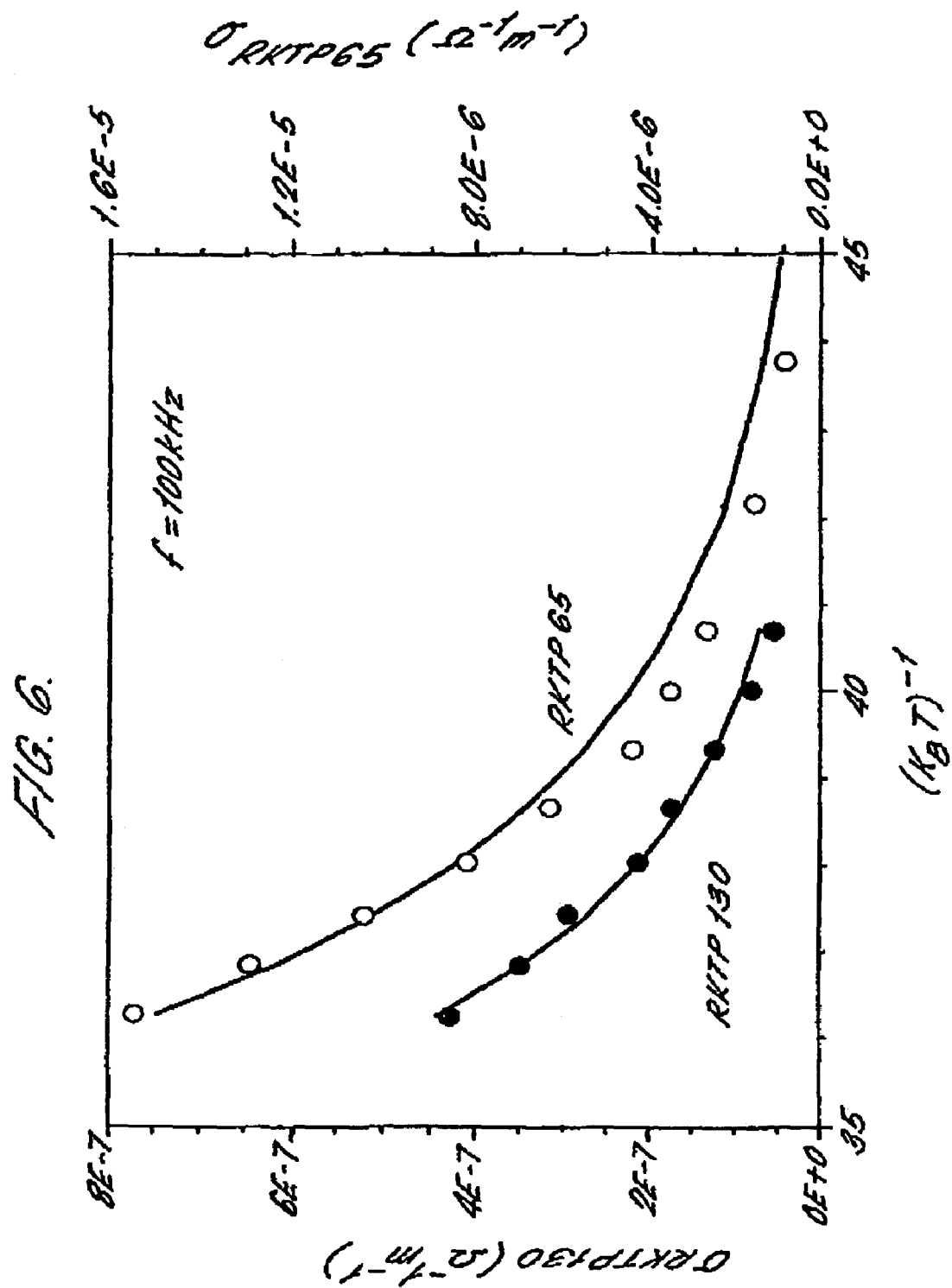
FIG. 6 shows fitting curves for the temperature-dependent conductivity of RKTP65 (invention) and RKTP130 (invention) to Equation 2 (see below)

FIG. 5 is a typical current response of RKTP65 crystals under an alternating electrical field, showing a highly nonlinear response. FIG. 5 indicates two peaks within half of the period:

(1) the first is approximately at E=0, corresponding to $\theta=\pi/2$ and $ctg\theta=\sigma/\omega\in\in_o=0$;

(2) the second is-near the peak of the electric field, having a phase advance $\theta\approx 5.76°$ for the three occasions in FIG. 5 (two near $E=-E_m$ and one near $E=E_m$, where $E_m$ is the amplitude of the electric field). An estimate can be made by using Equation 3 as the amplitude of the electric field $E_a=1.52\times 10^6$ V/m and the current density of the second peak in FIG. 4 $J_a$=2.98 Am$^{-2}$. Accordingly, the conductivity that this peak corresponds to is: $\sigma=\cos\theta$. ($J_a/E^m$)=$2\times 10^{-6}$ $\Omega^{-1}$m$^{-1}$. This value is about two orders higher than that ($\sigma<10^{-6}$ $\Omega^{-1}$m$^{-1}$) measured under a smaller voltage (<1 V) by using an impedance analyser. These two peaks prove that the conductivity of RKTP is changing with electric field and the phase advance $\theta$ should be a function of electric field. This implies that, when a RKTP crystal is subject to a high voltage, the thermal effect will become substantial and blacken the crystal. Consistent with this, applying a voltage of 1 KV/mm for 20 to 30 seconds was found to discolour a RKTP crystal, changing it from colourless to grey.

Domain Switching in RKTP Crystals

A distorted hysteresis loop of RKTP65 is shown in FIG. 8. The rounded ends result from the conducting current at high electric fields, which cannot be compensated. This results from the field dependent conductivity as previously observed (see P Groves, A M Glazer and D T Smith, Journal Physics E: Instrum. 17 (1984). 95).

This distortion was ignored in the low-temperature poling of KTP by Rosenman et al (Applied Physics Letters 73 (1998) 3650) resulting in a measurement of the spontaneous polarisation, which was less than the remanent polarisation. The accepted criterion for determining the amount of compensation is that it should be increased until the parameter Q or the electric displacement in the high electric field range is linearly dependent on the electric field However, because of the field-dependent conductivity of RKTP crystals, the amount of compensation or voltage V cannot be determined by this general criterion. This means that it is difficult to measure the coercive electric field and spontaneous polarisation by hysteresis loop measurements to a high degree of accuracy.

Figure 7B:
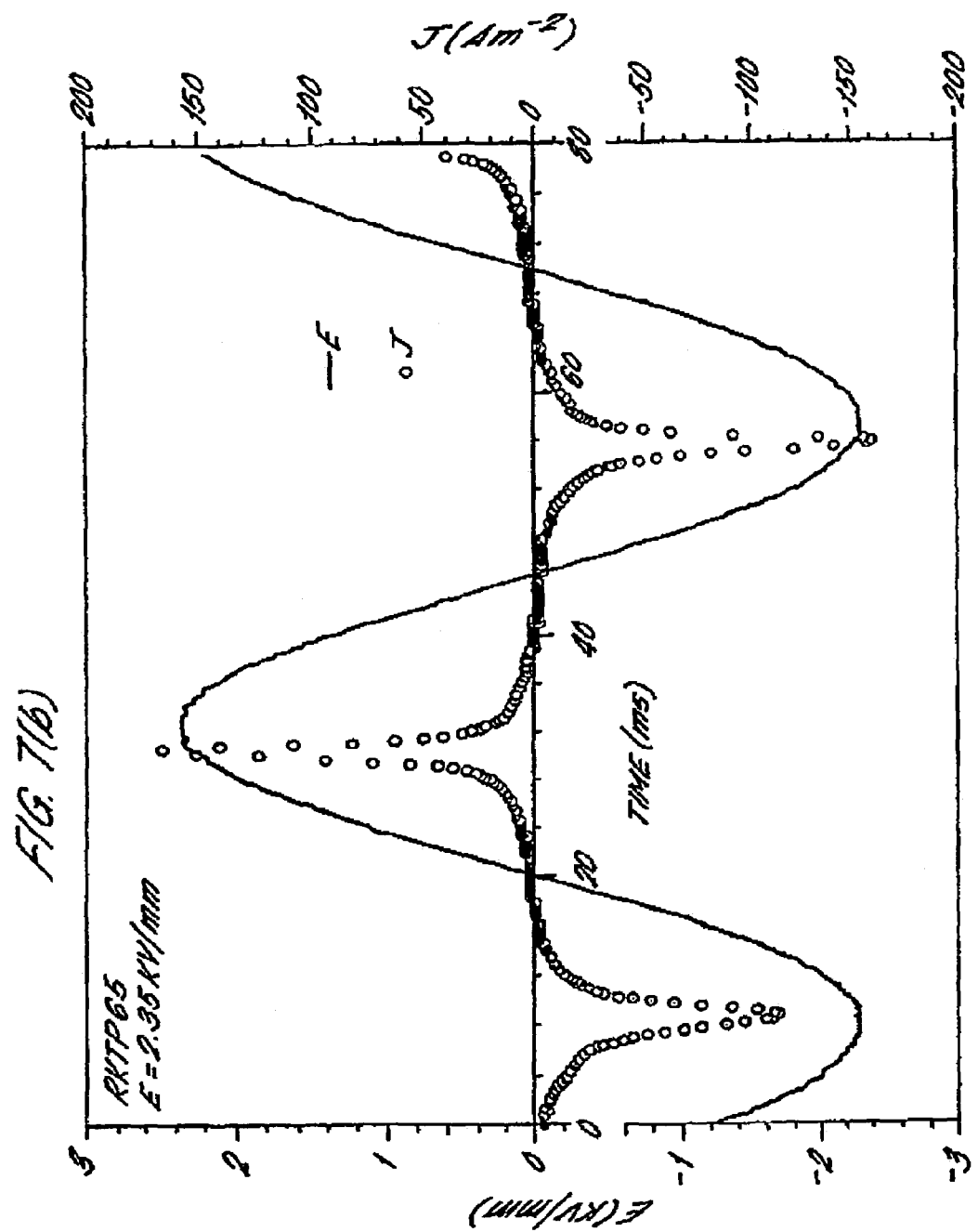

A series of switching current density peaks of RKTP65 crystal are shown in FIG. 9 and those for a RKTP130 are shown in FIG. 10. The area enveloped by a peak is given by the sum of twice the switching change of spontaneous polarisation and the charge density associated with the conducting and capacitance effects in the crystal. The maximum current density of the conducting and capacitance effect is estimated to be about 2 to 5% of the switching peak current by comparison with FIG. 7. Accounting for this, the spontaneous polarisation can be calculated. The switching time, calculated at 20% level of the peak current, the coercive electric field and the measured spontaneous polarization are listed in Table 3. These parameters show that for RKTP65, although there are some differences either in the switching times or in the peak currents, the measured spontaneous polarisations are almost the same. The differences can be attributed to thermal effects and to the redistribution of vacancies in the crystals. But for RKTP130 crystals, the spontaneous polarisation measured from the last peak is larger than those measured from first two peaks. Further measurements show that the spontaneous polarisation reached the value of 0.152 Cm$^{-2}$. Therefore, the first two peaks correspond to incomplete switching processes.

I will be noted that the peaks are not symmetric, especially those for RKTP130. Before the switching there is a gradual increase over a range of current, whereas after the switching the corresponding gradual decrease of current does not appear (FIG. 8). This suggests that the gradual increase is related to the displacement of $K^+$ ions taking part in the switching process, which were already on the way from crystallographic sites K1 and K2 to h1 and h2, respectively, as discussed by Thomas et al (Journal of Applied crystallography 24 (1992) 968).

Crystal Poling and Domain Structure

To assess the poling conditions revealed by this work, pieces of RKTP130 were poled by the application of 15 square waveforms (V=2.5 KV/mm, duration time τ=40 ms). In the poling process, positive waveforms were first applied. Then, a part of the electrode was removed and negative waveforms of the same character were applied to produce a domain boundary. After etching, it was observed that there were two regions having different pits and a boundary. One region containing small pits is the positive end of the polarisation while the other region containing large rectangular pits is the negative end of the polarisation.

TABLE 1

The dieelectric relaxation parameters obtained by fitting measured permittivity to the Cole-Cole equations.

|  | KTP | RTP | RKTP65 |
|---|---|---|---|
| α | 0.041 | 0.33 | 0.46 |
| $\tau_0$(ms) | 0.31 | 0.15 | 0.03 |
| $\epsilon_\infty$ | 14.1 | 12.3 | 11.5 |
| $\epsilon_0$ | 6534.3 | 47.7 | 18.4 |

TABLE 2

The parameters for the representation of conductivity of RKTP65, RTP and KTP

| Crystal | A | T(s) | S | $\frac{(\omega\tau)^2}{1+(\omega\tau)^2}$ at $\omega = 10^4$ Hz |
|---|---|---|---|---|
| KTP | 6.85 × 10⁻⁵ | 2.29 × 10⁻³ | 0.085 | 0.999952 |
| RTP | 2.35 × 10⁻⁷ | 7.03 × 10⁻⁵ | 0.211 | 0.951198 |
| RKTP65 | 5.31 × 10⁻⁹ | 6.58 × 10⁻⁶ | 0.486 | 0.145950 |

TABLE 3

The ionic active energy $E_a$ (eV) and the parameter $\sigma_o$ of RKTP crystals at f = 100 KHz

|  | $E_a$ (eV) | $e^{-\frac{E_o}{K_S T}}$ at T = 290 K. | $\sigma_o$ ($\Omega^{-1}m^{-1}K$) |
|---|---|---|---|
| KTP | 0.3312 | 1.76 × 10⁻⁶ | 1.55 × 10⁴ |
| RTP | 0.3905 | 1.67 × 10⁻⁷ | 7.63 × 10³ |
| RKTP65 | 0.3898 | 1.74 × 10⁻⁷ | 7.18 × 10³ |
| RKTP130 | 0.473 | 6.07 × 10⁻⁹ | 4.32 × 10³ |

TABLE 4

The correlation functions and the activation energy of Rb.

|  | $e^{zc^z}C_k(f_{KK} + f_{KR})$ | $e^{zc^z}C_k(f_{RbRb} + f_{RbK})$ | $E_{Rb}$(eV) |
|---|---|---|---|
| RKTP65 | 0.0558 | 0.927 | 0.452 |
| RKTP130 | 1.4 × 10⁻⁴ | 0.1475 | 0.452 |

TABLE 5

The switching time τ (ms), coercive field $E_c$(KV/mm) and measured spontaneous polarisation $p_s$ (Cm⁻²) of RKTP130 crystals: The numbering of the peaks is in the sequence of time.

|  | No. 1 | | | No. 2 | | | No. 3 | | |
|---|---|---|---|---|---|---|---|---|---|
| Peak No. | τ | $p_s$ | $E_c$ | τ | $p_s$ | $E_c$ | τ | $p_s$ | $E_c$ |
| RKTP65 | 6 | 0.162 | 2.3 | 4.5 | 0.156 | 2.3 | 4.5 | 0.178 | 2.3 |
| RKTP130 | 4 | 0.0101 | 2.3 | 7 | 0.103 | 3 | 3 | 0.138 | 2.3 |

The results indicate that rubidium ions in the doped KTP crystals makes the dielectric relaxation further from Debye response. The rubidium ions also decrease the conductivity of the crystals, probably through the mixed alkali effect.

The results also indicate that there is a doping concentration window within which the conductivity is very significantly reduced and domain reversal can be achieved by electric poling at room temperature. At lower doping concentrations the reduction in conductivity is not sufficient to sustain a poling field at room temperature, and at higher concentrations the conductivity is low but switching is inhibited.

The present invention results in a suppression of the conductivity by a factor of typically up to 100 compared with standard flux-grown KTP. This allows an electric field, which is sufficient for inversion of ferroelectric domains, to be applied at room temperature, thus enabling room temperature fabrication of periodically-domain-inverted (PDI) crystals for non-linear optical devices.

A further advantage of the present invention is a reduction in grey track resistance, i.e. the thermal deterioration of a crystal when subjected to laser energy. While not wishing to be bound by theory, this is thought to be because the doped material is more stoichiometric compared with the prior art undoped materials, resulting in improved crystal properties.

The invention claimed is:

1. A non-linear optical crystal of a compound having the general formula $D_xM_{1-x}TOZO_4$, including isomorphs thereof, where:
   D is a dopant which comprises one or both of Rb and Cs;
   M is selected from one or both of K and Ag;
   T comprises one or more of Ti, Sn and Ge, optionally together with one or both of Nb and Ta;
   Z is selected from one or both of P and As, optionally together with one or both of Ge and Si; and
   $0<x\leq0.1$, wherein the non-linear optical crystal further includes an additional dopant selected from one or more of Ce, Ga, Er, In, Sc and W.

2. A non-linear optical crystal as claimed in claim 1 having the formula $Rb_xK_{1-x}TiOPO_4$ or $Rb_xK_{1-x}TiOAsO_4$.

3. A non-linear optical crystal as claimed in claim 1, wherein $0.001\leq x\leq0.05$, preferably $0.007\leq x\leq0.02$, more preferably $0.009\leq x\leq0.017$, still more preferably $0.011\leq x\leq0.015$.

4. A non-linear optical crystal as claimed in claim 1 having the formula $Rb_xK_{1-x}TiOPO_4$, where $0.011\leq x\leq0.015$, more preferably $0.012\leq x\leq0.014$, still more preferably x is approximately 0.013.

5. A nonlinear optical crystal as claimed in claim 1, wherein said additional dopant is present in the crystal in an amount of up to 5 atomic % with respect to M.

6. A non-linear optical crystal from the $KTiOPO_4$ (KTP) family of isomorphs which includes a dopant selected from one or both of Rb and Cs, the dopant being present in the crystal in an amount of up to 10 atomic % with respect to K, preferably in an amount of from 0.9 to 1.7 atomic % with respect to K, wherein the non-linear optical crystal further includes an additional dopant selected from one or more of Ce, Ga, Er, In, Sc and W.

7. A non-linear optical crystal as claimed in claim 6, wherein said additional dopant is present in the crystal in an amount of up to 5 atomic % with respect to K.

8. A non-linear optical crystal as claimed in claim 1, wherein the dopant is substantially homogeneously distributed in the crystal.

9. A non-linear optical crystal as claimed in claim 1, which is a periodically-domain-inverted crystal.

10. A process for the preparation of a doped non-linear optical crystal as defined in claim 1 or an isomorph thereof, which process comprises:
   (a) providing a mixture of starting materials comprising (i) $MTOZO_4$ and (ii) a flux comprising M, Z and O, or their precursors, where M is selected from one or both of K and Ag, T comprises one or more of Ti, Sn and Ge, optionally together with one or both of Nb and Ta, Z is selected from one or both of P and As, optionally together with one or both of Ge and Si, and (iii) a source of a dopant D, where D comprises one or both of Rb and Cs and an additional dopant selected from one or more of Ce, Ga, Er, In, Sc and W;
   (b) heating said mixture to at least a temperature sufficient to form a substantially saturated solution of $MTOZO_4$ in said flux;
   (c) contacting a seed crystal of $MTOZO_4$ with said substantially saturated solution; and
   (d) controllably reducing the temperature of the substantially saturated solution to thereby grow a crystal having the general formula $D_xM_{1-x}TOZO_4$, where $0 < x \leq 0.1$.

11. A process as claimed in claim 10, wherein the flux composition is based on a $M_2O$—$Z_2O_5$ system.

12. A process as claimed in claim 10, wherein the ratio of the starting materials (i) and (ii), or their precursors, lies within the region of the ternary phase diagram $M_2O/Z_2O_5/(TO_2)_2$ in which $MTOZO_4$ is the only stable solid phase in equilibrium with the flux when molten.

13. A process as claimed in claim 10, wherein the concentration ratio of the starting materials (i) and (ii) or their precursors is from 0.2 to 0.6 g/g $MTOZO_4$/flux.

14. A process as claimed in claim 10, wherein M is K, T is Ti, Z is P and the flux composition is based on the $K_2O$—$P_2O_5$ system.

15. A process as claimed in claim 14, wherein the flux composition is based on $K_5P_3O_{10}$, $K_6P_4O_{13}$ or $K_7P_3O_{11}$.

16. A process as claimed in claim 10, wherein M is K, T is Ti, Z is As and the flux composition is based on the $K_2O$—$As_2O_5$ system.

17. A process as claimed in claim 16, wherein the flux composition is based on $K_5As_3O_{10}$, $K_6As_4O_{13}$ or $K_7As_3O_{11}$.

18. A process as claimed in claim 10, wherein the source of the dopant D comprises or consists of $Rb_2CO_3$.

19. A process as claimed in claim 10, wherein the concentration of the dopant D with respect to M in the mixture of starting materials is $\leq 5$ at. %, preferably $\leq 4$ at. %.

20. A process as claimed in claim 19, wherein the concentration of the dopant D with respect to M in the mixture of starting materials is in the range of from 1 to 2 at. %, preferably from 1.2 to 1.9 at. %, more preferably from 1.6 to 1.8 at. %.

21. A process as claimed in claim 10, wherein the mixture is heated to at a temperature in the range of from 900 to 800° C., preferably 880 to 810° C., more preferably from 866 to 818° C. to form the substantially saturated solution of $MTOZO_4$ in the flux.

22. A process as claimed in claim 10, wherein the temperature of the substantially saturated solution is cooled at a rate of from 1 to 0.005° C./hour, preferably from 0.5 to 0.01° C./hour, more preferably from 0.03 to 0.01° C./hour.

23. A process as claimed in claim 10, wherein, in the grown crystal having the general formula $D_xM_{1-x}TOZO_4$, $0.001 \leq x \leq 0.05$, preferably $0.007 \leq x \leq 0.02$, more preferably $0.009 \leq x \leq 0.017$, still more preferably $0.011 \leq x \leq 0.015$.

24. A process as claimed in claim 10, wherein the temperature of the substantially saturated solution is controllably reduced to maintain a substantially linear increase in the weight of the growing crystal.

25. A process as claimed in claim 10, wherein the temperature of the substantially saturated solution is controllably reduced such that the overall growth profile (weight of crystal vs time) of the crystal is non-linear, the growth profile being made up of individual linear growth steps with each successive growth step having a higher gradient than the preceding growth step.

26. A process as claimed in claim 10, wherein the seed crystal is aligned along the b-axis of c-axis.

27. A process as claimed in claim 10, further including the step of subjecting the grown doped non-linear optical crystal or isomorph thereof to periodic domain inversion.

28. A process as claimed in claim 27, wherein the step of subjecting the grown doped non-linear optical crystal or isomorph thereof to periodic domain inversion is carried out at a temperature in the range of from 0 to 50° C., preferably from 15 to 40° C., more preferably from 20 to 30° C.

29. A non-linear optical device including a non-linear optical crystal as defined in claim 1.

30. A non-linear optical device as claimed in claim 29 which is a quasi-phase-matched device.

31. A non-linear optical device as claimed in claim 29 which is a waveguide device, a second-harmonic generator, an oscillator, an electro-optic modulator, a parametric amplifier.

32. A laser which includes a non-linear optical crystal as defined in claim 1.

33. A laser as claimed in claim 33 which is a Nd-YAG laser.

34. A method of reducing the room temperature conductivity of a single crystal of $KTiOPO_4$, $KTiOAsO_4$ or an isomorph thereof, which method involves the substantially homogeneous bulk doping of the single crystal with up to 10 at. % Rb, and an additional dopant selected from one or more of Ce, Ga, Er, In, Sc and W, with respect to K.

35. A method as claimed in claim 34, wherein the method involves doping the single crystal with from 0.1 to 5 at. % Rb with respect to K, preferably from 0.7 to 2 at. % Rb with respect to K, more preferably from 0.9 to 1.7 at. % Rb with respect to K, still more preferably from 1.1 to 1.5 at. % Rb with respect to K.

36. A method as claimed in claim 34, wherein doping of the single crystal is achieved by incorporating Rb into the crystal during the growth by a top-seeded solution growth technique or a flux growth technique.

37. A process for the preparation of a Rb and/or Cs doped non-linear optical crystal, which process comprises:
   (a) providing a mixture of starting materials comprising (i) $MTOZO_4$ and (ii) a flux comprising M, Z and O, or their precursors, where M is selected from one or both of K and Ag, T comprises one or more of Ti, Sn and Ge, optionally together with one or both of Nb and Ta, Z is selected from one or both of P and As, optionally together with one or both of Ge and Si, and (iii) a source of a dopant D, where D comprises one or both of Rb and Cs and an additional dopant selected from one or more of Ce, Ga, Er, In, Sc and W;
   (b) heating said mixture to at least a temperature sufficient to form a substantially saturated solution comprising $MTOZO_4$ in said flux;
   (c) contacting a seed crystal of $MTOZO_4$ with said substantially saturated solution; and
   (d) controllably reducing the temperature of the substantially saturated solution to thereby grow a crystal in which up to 10 at. % of dopant D is substituted for M.

* * * * *